(12) United States Patent
Fuller

(10) Patent No.: US 11,147,188 B2
(45) Date of Patent: Oct. 12, 2021

(54) HEAT EXCHANGER FOR COOLING AN ELECTRONIC ENCLOSURE

(71) Applicant: Pfannenberg GmbH, Hamburg (DE)

(72) Inventor: Russell Fuller, Lancaster, NY (US)

(73) Assignee: PFANNENBERG GMBH, Hamburg (DE)

( * ) Notice: Subject to any disclaimer, the term of this patent is extended or adjusted under 35 U.S.C. 154(b) by 0 days.

(21) Appl. No.: 15/985,891

(22) Filed: May 22, 2018

(65) Prior Publication Data

US 2018/0338392 A1 Nov. 22, 2018

(30) Foreign Application Priority Data

May 22, 2017 (EP) ..................................... 17172117
May 17, 2018 (EP) ..................................... 18172889

(51) Int. Cl.
| | |
|---|---|
| *F28D 15/02* | (2006.01) |
| *H05K 7/20* | (2006.01) |
| *F28F 9/26* | (2006.01) |
| *B23P 15/26* | (2006.01) |

(52) U.S. Cl.
CPC .......... *H05K 7/20327* (2013.01); *B23P 15/26* (2013.01); *F28D 15/0275* (2013.01); *F28F 9/262* (2013.01); *H05K 7/206* (2013.01); *H05K 7/20309* (2013.01); *H05K 7/20318* (2013.01); *H05K 7/20336* (2013.01)

(58) Field of Classification Search
CPC ...... H05K 7/20; H05K 7/206; H05K 7/20336; H05K 7/20327; H05K 7/20309; H05K 7/20318; F28F 9/26; F28F 1/022; F28F 9/262; B23P 15/26; F28D 15/0266; F28D 15/0233; F28D 1/05391; F28D 15/025; F28D 2015/0225; F28D 15/0275; F28D 15/02

See application file for complete search history.

(56) References Cited

U.S. PATENT DOCUMENTS

| | | | |
|---|---|---|---|
| 4,475,358 A | | 10/1984 | Seifert et al. |
| 5,806,583 A | * | 9/1998 | Suzuki ................ F28D 15/0233 165/104.14 |
| 6,119,767 A | * | 9/2000 | Kadota ............... F28D 15/0233 165/104.33 |
| 6,185,957 B1 | | 2/2001 | Voss et al. |
| 2002/0014324 A1 | | 2/2002 | DiPaolo |
| 2006/0146496 A1 | | 7/2006 | Asfia et al. |

(Continued)

FOREIGN PATENT DOCUMENTS

| | | |
|---|---|---|
| CN | 101818999 A | 9/2010 |
| CN | 102083297 A | 6/2011 |

(Continued)

OTHER PUBLICATIONS

European Search Report dated Nov. 3, 2017 from related European Application No. 17172117.8.

*Primary Examiner* — Harry E Arant

(74) *Attorney, Agent, or Firm* — Grogan, Tuccillo & Vanderleeden, LLP

(57) ABSTRACT

In order to reduce the dimensions and costs of a heat exchanger, while at the same time increasing its heat effectiveness, it is suggested to configure the heat exchanger such that a condenser side and an evaporator side of the heat exchanger are separated from each other by a barrier.

12 Claims, 13 Drawing Sheets

(56) References Cited

U.S. PATENT DOCUMENTS

| | | | |
|---|---|---|---|
| 2011/0127011 A1* | 6/2011 | Agostini | F28D 15/0266 |
| | | | 165/104.21 |
| 2013/0221774 A1 | 8/2013 | Agostini et al. | |
| 2013/0258594 A1 | 10/2013 | Gradinger et al. | |
| 2016/0341459 A1 | 11/2016 | Kreeley et al. | |
| 2017/0059253 A1 | 3/2017 | Laurila et al. | |
| 2017/0108279 A1* | 4/2017 | Webb | F28D 1/0477 |
| 2018/0216892 A1* | 8/2018 | Kaneko | F28F 1/025 |

FOREIGN PATENT DOCUMENTS

| | | | | |
|---|---|---|---|---|
| EP | 2284846 A1 * | 2/2011 | | F28D 1/05383 |
| EP | 2284846 A1 | 2/2011 | | |

* cited by examiner

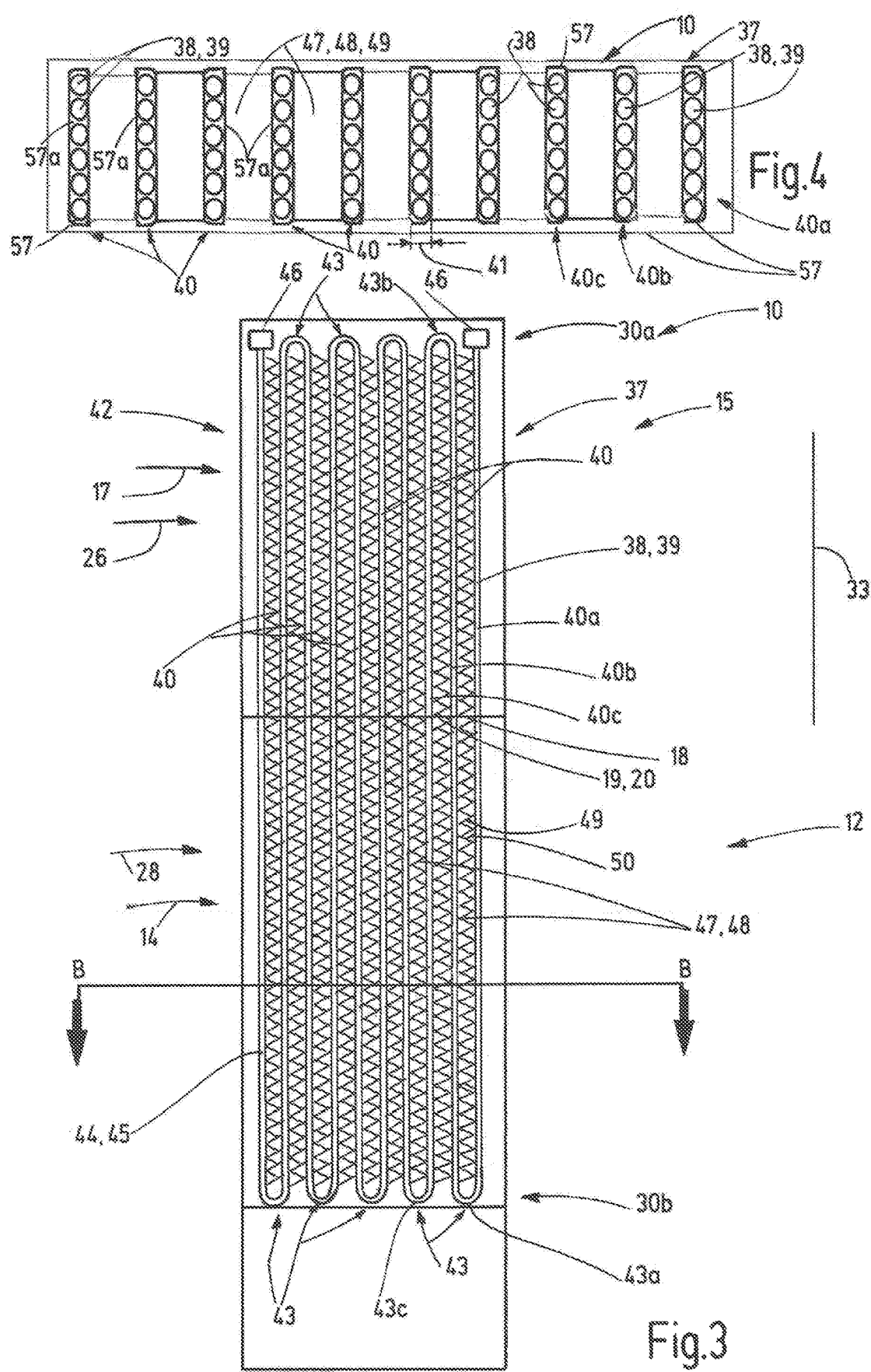

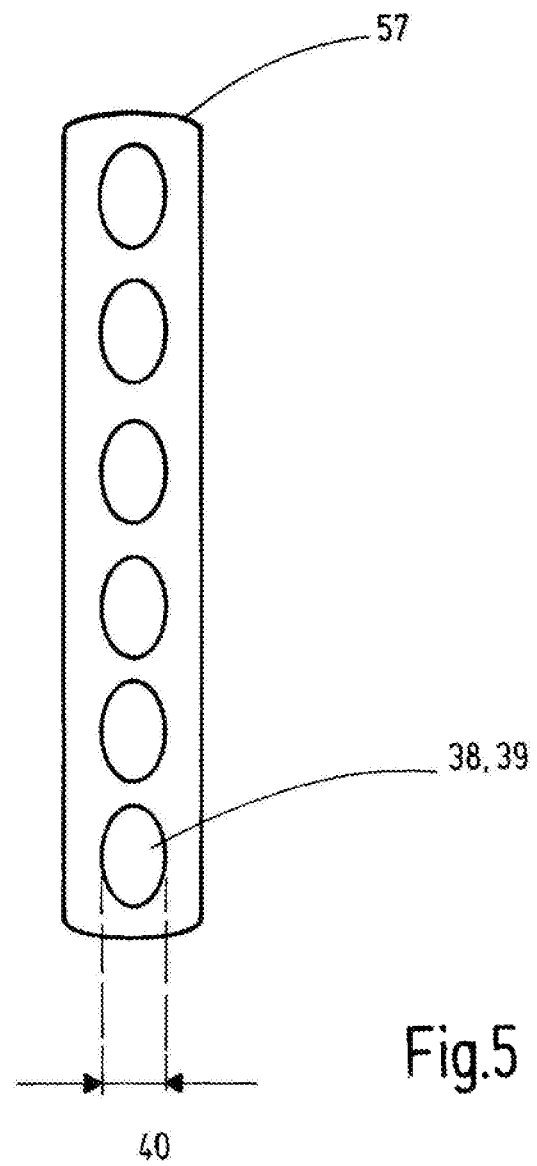

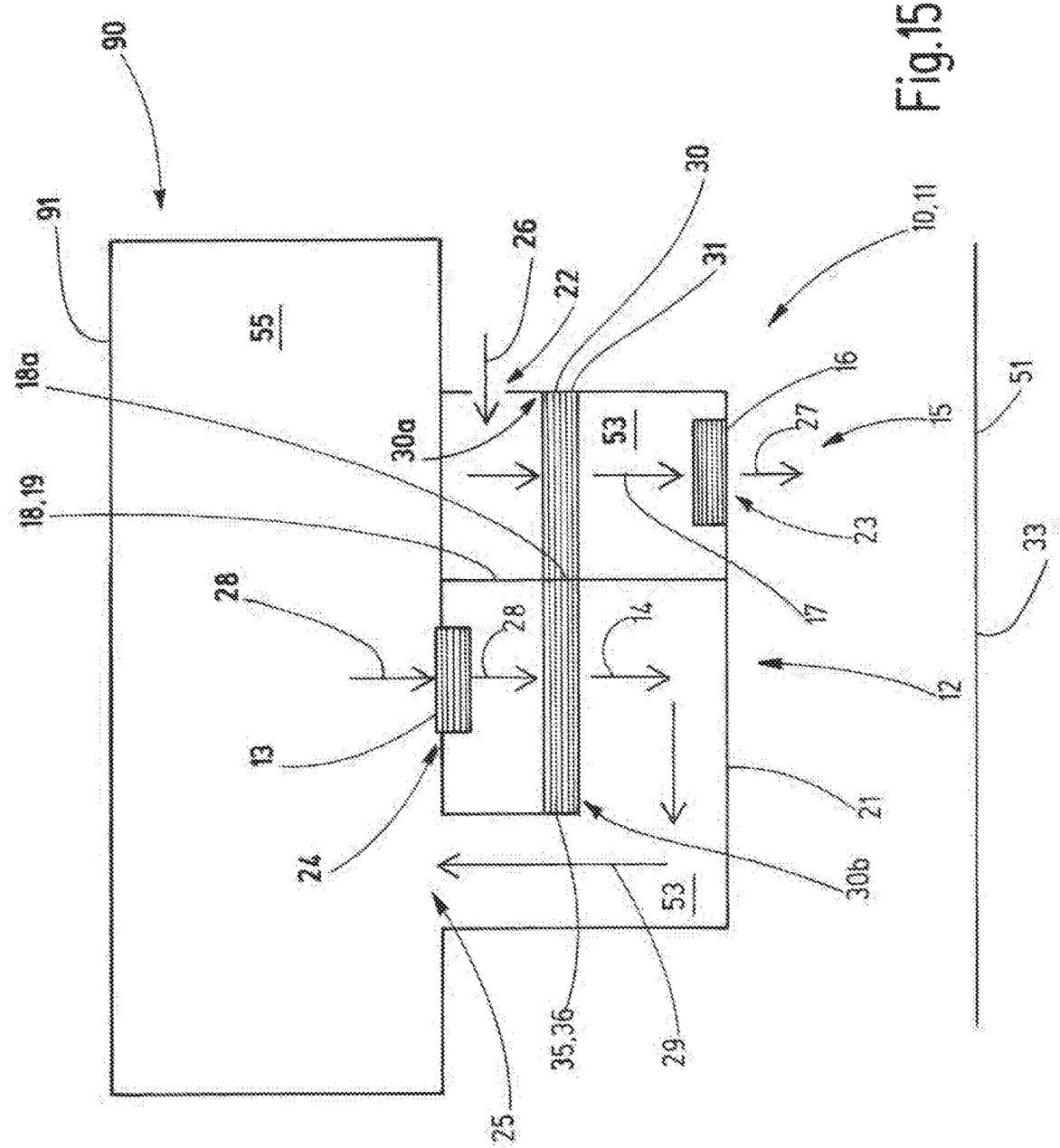

HEAT EXCHANGER FOR COOLING AN ELECTRONIC ENCLOSURE

CROSS REFERENCE TO RELATED APPLICATION

This application claims the benefit of European Patent Application Serial No. EP 17172117.8, filed on May 22, 2017, and European Patent Application Serial No. EP 18172889.0 filed on May 17, 2018, each of which are herein incorporated by reference in their entirety.

FIELD OF THE INVENTION

The present invention relates to a heat exchanger for cooling an electronic enclosure. Further, the invention is concerned with a method for producing a heat exchanger for cooling an electronic enclosure as well as a use of a pulsating heat pipe in a heat exchanger for cooling an electronic enclosure.

SUMMARY OF THE INVENTION

The present invention suggests a heat exchanger for cooling an electronic enclosure comprising a condenser side and an evaporator side wherein the condenser side and the evaporator side are separated from each other by a barrier.

The heat exchanger is preferably an air-to-air heat exchanger. The heat exchanger acts as an electronic enclosure cooling unit. Advantageously, the condenser side and the evaporator side are completely separated by the barrier. In particular, the barrier is configured as an air side barrier for completely separating the first air stream on the evaporator side and the second air stream on the condenser side. For this purpose, the barrier can be air tight.

The heat exchanger is especially configured for electronic enclosure cooling scenarios in which the ambient air of the enclosures is contaminated by dust, liquid, gases, etc. The barrier prevents ingress of contaminates, especially from an outside of the electronic enclosure, into the inside of the electronic enclosure. Preferably, the barrier is formed by a solid plate, especially a metal plate, in particular made from aluminum or plastic, or by a caulk. The barrier can advantageously be formed by an inner wall of a casing of the heat exchanger.

The term "electronic enclosure" especially refers to an enclosure of electronic equipment which produces a heat load, such as e.g. a switch cabinet. Preferably, the electronic enclosure is characterized by the feature that the ambient temperature, i.e. the temperature outside of the electronic enclosure, is lower than the interior temperature, i.e. the temperature inside the electronic enclosure.

The electronic enclosure enclosures could be placed inside or outside. Outside applications would for example include waste water management or telecommunication shelters, wherein indoor applications could for example include wash-down scenarios (for example in the food and beverage industry) or scenarios where a high level of corrosion safety has to be guaranteed. Generally speaking, the heat exchanger according to the invention can be applied in any electronic enclosure cooling scenario where the ambient temperature is lower than the interior temperature. Thus, the heat exchanger is in particular configured to be used for indoor applications as well as outdoor applications.

In particular, the heat exchanger comprises a casing defining an inside and an outside of the heat exchanger, wherein the evaporator side and the condenser side are placed in the inside of the heat exchanger. The casing of the heat exchanger is preferably attachable, further preferred attached, to the outside of the electronic enclosure, especially to a casing of the electronic enclosure.

The heat exchanger advantageously comprises an evaporator fan for producing a first air stream on the evaporator side and a condenser fan for producing a second air stream on the condenser side, wherein the barrier is configured to separate the first air stream and the second air stream. Especially, the evaporator fan is disposed on the evaporator side, wherein the condenser fan is disposed on the condenser side of the heat exchanger. The evaporator fan and/or the condenser fan are preferably disposed in the inside of the heat exchanger. The condenser fan is preferably configured to draw in cool ambient air from the outside of the heat exchanger into the inside of the heat exchanger especially on the condenser side. The condenser fan is disposed such within the heat exchanger that it allows hot air to be exhausted from the heat exchanger. On the other hand, the evaporator fan is disposed such that it draws in hot air from the electronic enclosure. The drawn-in cool ambient air travels through the condenser side and forms the second air stream, while the drawn-in hot air from the electronic enclosure travels through the evaporator side and forms the first air stream.

Further preferred, the heat exchanger comprises a heat exchanging element which has an extruded metallic material. Preferably, the heat exchanging element is formed from the extruded metallic material. The heat exchanging element is preferably a pulsating heat pipe. In particular, this means that it is a heat transfer device using thermal conductivity and face transmission to effectively manage the transfer of heat between the evaporator side and the condenser side. The metallic material is preferably aluminum. The heat exchanging element preferably does not comprise copper.

Advantageously, the entire functional portion of the heat exchanging element is made of one metallic material. With the heat exchanging element being made of only one metal, it is more corrosion resistant than a traditional heat exchanging element comprising more than one metal, wherein due to this bi-metal configuration galvanic corrosion could result. The heat exchanging element can further be electromechanically plated or coated in a metal or metal rich compound, said metal or metal rich compound acting as a sacrificial anode and thus providing cathodic protection to the functional portion of the heat exchanging element. The above-mentioned metal for this protection is preferably Zinc. The term "functional portion" of the heat exchanger especially refers to the entire heat exchanger except for a possible coating.

The heat exchanging element has a longitudinal direction. The condenser fan and the evaporator fan are preferably arranged such that the first air stream and a second air stream both penetrate the heat exchanging element, preferably substantially perpendicular through the longitudinal direction of the heat exchanging element. In particular, the barrier is arranged perpendicular through the longitudinal direction of the heat exchanging element.

For producing the first and/or the second air stream the casing preferably has two openings on the evaporator side and the condenser side, respectively.

On the condenser side the casing of the heat exchanger preferably comprises a first opening for letting cool ambient air from an outside of the heat exchanger enter the inside of the heat exchanger. The cool ambient air is drawn in through the first opening on the condenser side by means of the condenser fan. The condenser fan is particularly arranged such that after entering the inside through the first opening the cool ambient air passes through the heat exchanging element towards the condenser fan. The casing further preferred has a second opening for letting hot air exit the inside of the heat exchanger at its condenser side to the outside. By "hot air" the ambient air which is heated by means of passing through the heat exchanging element is meant. The cool ambient air passing through the heat exchanging element and exiting by the second opening to the outside of the heat exchanger in form of hot, i.e. heated, air forms the second air stream. In particular, the condenser fan is disposed at and/or in the second opening of the casing. Alternatively, the condenser fan can draw in cool ambient air through the second opening, while the first opening then serves as an exit for the heated air. Especially, the condenser fan can reverse its direction of rotation and is thus configured to pull air through the heat exchanging element or push air through it.

On the evaporator side the casing of the heat exchanger particularly comprises a third opening for letting hot air from an inside of the electronic enclosure enter the inside of the heat exchanger. For this purpose, also the casing of the electronic enclosure can have an opening which is aligned to the third opening. The hot air is drawn in from the electronic enclosure to an inside of the heat exchanger by means of the evaporator fan which is further preferred disposed at and/or in the third opening.

The evaporator fan is particularly arranged such that the drawn in hot air passes through the heat exchanging element and returns back through a fourth opening in the casing in form of cool air, i.e. cooled by means of passing through the heat exchanging element, to the inside of the electronic enclosure. The hot air from the electronic enclosure travelling through the heat exchanging element and returning to the electronic enclosure forms the first air stream being produced by the evaporator fan. The third and the fourth opening are advantageously arranged such that after passing the heat exchanging element and before returning to the inside of the electronic enclosure the first air stream is deflected on an inner wall of the casing. Alternatively, the evaporator fan can draw in cool ambient air through the fourth opening, while the third opening then serves as an exit for the cooled air. Especially, the evaporator fan can reverse its direction of rotation and is thus configured to pull air through the heat exchanging element or push air through it.

Based on its configuration the heat exchanger is less complex and less expensive regarding its production. In addition, the heat exchanger has a higher specific cooling capacity since it has a particularly large amount of surface area for the heat transfer. By this, the heat amount which can be moved per volume of the heat exchanger is increased. As a consequence, the volume of the heat exchanger can be reduced while maintaining the same heat transfer. In this regard, volume reductions of up to 62%/W/° C.ΔT can be achieved.

The heat exchanger according to the invention is smaller and more cost effective when compared to state of the art heat exchangers. Furthermore, the heat exchanger according to the invention can be configured to have a similar functionality as known heat exchangers but have a smaller physical volume per specific cooling capacity of the unit. The heat exchanger is thus more compact. It can be configured to be substantially shorter in a direction of the heat exchanger which is parallel to the longitudinal direction of the heat exchanging element. Preferably, this is the vertical direction.

In particular, the heat exchanging element comprises a first end area being disposed on the evaporator side and a second end area being disposed on the condenser side. Especially, the heat exchanging element comprises a first end area being disposed on the condenser side and a second end area being disposed on the evaporator side. The heat exchanging element is preferably disposed such that it penetrates the barrier so that its first end area is disposed on the evaporator side and with its second part on the condenser side of the heat exchanger. This penetration of the barrier is preferably sealed on the air side of the heat exchanging element so that nonetheless a complete separation of the condenser side and the evaporator side is ensured.

Further preferred, the heat exchanging element has a plurality of channels. These channels are preferably of capillary dimension. The channels are advantageously configured as micro-channels.

The channels are preferably configured as being ports, advantageously the only ports, of at least one larger mini-channel. This at least one mini-channel can have a substantially rectangular shape in a cross direction wherein the channels are aligned within the mini-channel in a straight way. This alignment results in the substantially rectangular shape of the mini-channel. The heat exchanging element especially comprises only one mini-channel preferably having 2 to 25, further preferred 4 to 10, most preferred 5 to 7, channels. In particular, the mini-channel has 6 channels. By having only one mini-channel no wicking structure has to be provided as opposed to prior art heat exchanger constituting another advantage of the present invention.

Advantageously, the mini-channel has a shorter cross dimension of between 0.1 mm and 12 mm, preferably between 0.2 mm and 10 mm, further preferred between 0.4 mm and 6 mm, most preferred between 2 mm and 5 mm, while the larger cross dimension lies between 0.6 mm and 240 mm, preferably between 1.2 mm and 200 mm, further preferred between 2.4 mm and 120 mm, most preferred between 12 mm and 100 mm.

In particular, the channels are partially filled with a refrigerant. This refrigerant is preferably a two-phase refrigerant which is present within the channels in a liquid state and a gaseous state. The filling ratio of the channels is between 10% and 95%, especially between 30% and 80%. Further preferred, the filling ratio is between 50% and 80%, especially between 50% and 75%. These filling ratios improve the performance of the heat exchanger. The channels which are filled by means of fill ports which allow the heat exchanging element to be evacuated and partially filled with the refrigerant.

Most preferred the refrigerant is R-134A and R-407C. The refrigerant is configured such that it does not create any reaction with the material of the heat exchanger and does not create any non-condensable gas. Furthermore, the refrigerant is configured such that the heat exchanger has enough strength to endure the gas pressure of the refrigerant used.

Advantageously, the two-phase refrigerant is present within the channels in a gaseous state and a liquid state. This means that the channels are filled with liquid parts and gaseous parts of the two-phase refrigerant which do not form a continuous phase respectively. Rather, the liquid parts and gaseous parts are intermixed. The gaseous parts are formed by gas bubbles, while the liquid parts are formed by drops or larger accumulations of liquid.

On the evaporator side the refrigerant is preferably heated by means of the first air stream. As a consequence of the heating, the refrigerant, especially its liquid parts, evaporates partially on the evaporator side. The gaseous parts, i.e.

the gas bubbles, coalesce into larger bubbles which eventually occupy the respective entire channel cross section. Due to the capillary dimensions of the channels these act to restrict the fluid so that liquid parts of the refrigerant are trapped between gaseous parts and cannot pass one another due to the surface tension of the liquid parts. The transport of the refrigerant is based on positive and negative pressures (in relation to saturation pressure) created by evaporation and condensation on the evaporator side and the condenser side. Evaporation caused by heating by means of the first air stream on the evaporator side creates a localized high pressure region repelling the refrigerant away from that region and towards the condenser side. Conversely, condensation of the refrigerant caused by cooling by means of the second air stream on the condenser side creates a localized low pressure region which pulls the refrigerant toward the condensing side. The key to these driving forces is that they are localized and when a local movement in one channel section is caused, movement is also created in adjacent channels sections due to the serpentine configuration. In general, this creates refrigerant flow back and forward between the evaporator side and the condenser side across the barrier of the heat exchanger.

Advantageously, a cross dimension of the channels, preferably a diameter, is small enough so that the surface tension of the liquid parts of the refrigerant is able to prevent the gaseous parts of the refrigerant from passing them towards the condenser side. By this, the gaseous parts moving towards the condenser side take the liquid parts with them. Furthermore, it is advantageous to have a possibly large cross dimension of the channels for the following two reasons: flow restrictions within the channels should be reduced, while at the same time the mass flow rate of the refrigerant should be increased. Since there are reasons for increasing the cross dimension and reasons for reducing it, a desirable compromise has been found by preferably configuring the channels. A cross dimension of the channels is between 0.1 mm and 12 mm, preferably between 0.2 mm and 10 mm, further preferred between 0.4 mm and 6 mm, most preferred between 2 mm and 5 mm. Further, the channels can have a cross dimension between 0.5 mm and 2 mm, especially between 1 mm and 1.4 mm, in particular between 1.1 mm and 1.3 mm. Advantageously, the channels have a cross dimension of 1.2 mm.

The term "cross dimension" means a dimension in cross direction to the longitudinal direction of the channels and/or the heat exchanging element. In particular, the channels have an oval shape. Most preferred the channels have a round shape so that the cross dimension refers to the diameter of the channels. In particular, the mini-channel is formed by extrusion, wherein the channels as ports of the mini-channel are formed during extrusion of the mini-channel.

The channels are advantageously configured bent into a serpentine configuration comprising a series of substantially parallel straight channel sections. In particular, the channels are bent multiple times, wherein each bend advantageously forms a 180° turn, so that after a bend the channels run parallel to its former course again. In other words, the channels are running parallel to each other and in a straight way in a first section, wherein after a bend, the channels run parallel to each other and also parallel to the course within the first section. The bends are preferably disposed at a first end area and/or a second end area of the heat exchanging element wherein the substantially straight sections extend from the first end area to the second end area. In particular, the serpentine configuration comprises one to thirty bends in each end area of the heat exchanging element, especially two to twelve bends, in particular three to four bends on each side.

The channels bent into a serpentine configuration can be configured in a closed loop or an open loop. To configure a closed loop configuration, the ends of the channels being configured in a serpentine way can be connected to each other, e.g. by means of a connection piece, such as a connection port or a manifold. Especially, the ends of the mini-channel comprising the channels can be connected to each other. Furthermore, multiple open loop heat exchanging elements can be connected to form a closed loop heat exchanging array. The ends of the mini-channels of the heat exchanging elements are connected such that a closed loop configuration results. In particular, the ends are brazed into a connection piece such as a connection port or a manifold. For this purpose, a first end of the mini-channel of a first heat exchanging element is connected to a first end of the mini-channel of a second heat exchanging element, while the second end of the mini-channel of the first heat exchanging element is connected to the second end of the mini-channel of the second heat exchanging element.

In particular, the heat exchanging element is a serpentine heat exchanging element. The serpentine configuration ensures that refrigerant passes the evaporator side and condenser side multiple times.

In particular, there can be check-valves incorporated into the refrigerant flow which favor the gaseous movement towards the condenser side of the heat exchanger as well as the mostly liquid return to the evaporator side.

Furthermore, the heat exchanger can comprise metal plates which are disposed between neighboring sections of the channels. Especially, the metal plates are disposed between neighboring sections of the mini-channel. The metal plates are preferably configured as fins, especially pleated fins. The fins are advantageously made of aluminum. The metal plates are preferably brazed between neighboring sections of the channels or rather neighboring channels of the mini-channel to help the heat transfer between the air on the condenser side and/or the evaporator side and the refrigerant within the channels by means of conduction. Apart from facilitating the heat transfer, the metal plates provide stability to the heat exchanging element. Especially, the metal plates are arranged such that there are counts of 4 metal plates per inch to 40 metal plates per inch, optimally 12 metal plates per inch to 25 metal plates per inch. The metal plates are particularly arranged in a V-shaped or U-shaped configuration. The metal plates can further be arranged louvered or not louvered. Advantageously, metal plates are arranged at an angle towards the direction in which the channels sections are extending, especially the longitudinal direction of the heat exchanger, wherein the angle preferably is between 0° and 90°, more preferred between 60° and 89.9°, even more preferred between 70° and 89.7°, most preferred between 80° and 89.5°. An angle between neighboring metal plates can be between 0° and 180°, more preferred between 0° and 90°, even more preferred between 0° and 45°, most preferred between 0° and 10°. The metal plates can have a constant thickness, wherein the thickness is advantageously between 0.01 mm to 5 mm, more preferred between 0.025 mm and 2.3 mm, even more preferred between 0.05 mm and 1 mm, most preferred between 0.07 mm and 0.4 mm.

In particular, the heat exchanger is arranged such that the condenser side is located higher than the evaporator side. The preferred orientation of having the evaporator side at a lower height than the condenser side creates an optimal performance of the heat exchanger. In particular, the condenser side is located above the evaporator side of the heat exchanger so that the condenser side is facing upwards. In such a configuration, the barrier separating the two sides extends in the horizontal direction. Despite of the fact that the preferred orientation of the heat exchanging element has the evaporator side at a lower height than the condenser side, the heat exchanging element is able to move heat in any direction. Alternatively, the condenser side and the evaporator side can be arranged at the same height, therefore horizontally next to each other.

The heat exchanger can comprise an array of heat exchanging elements. Particularly, the heat exchanging elements can be arranged in series or in parallel with regard to the air flow. Multiple heat exchanging elements can preferably be stacked in the cross direction of the heat exchanger to form a heat pipe array.

This arrangement has the advantage of gaining additional cooling capacity compared to a heat exchanger having only one heat exchanging element. In particular, the heat exchanger is configured as a finned air-to-air pulsating heat pipe or finned air-to-air pulsating heat pipe array.

Advantageously, the heat exchanger comprises multiple mini-channels wherein each mini-channel comprises multiple channels. Especially, each mini-channel comprises between 2 and 35, further preferred between 5 and 20, especially preferred between 10 and 15, channels. In particular, the mini-channels comprise 13 channels, respectively.

In particular, the heat exchanging element, especially the mini-channels, do not comprise any wicking structure, whose function it is to return condensate, in other words liquid, to the evaporator side. Especially due to this, the heat exchanger is very cost effective.

Advantageously, each mini-channel of the multiple mini-channels has a shorter cross dimension between 0.5 mm and 2 mm, especially between 1 mm and 1.4 mm, in particular between 1.1 mm and 1.3 mm. Preferably, the shorter cross dimension is 1.2 mm. The larger cross dimension can be between 5 mm and 20 mm, especially between 12 mm and 17 mm.

In particular, the mini-channels extend consistently in a straight way. In particular, a first end of each mini-channel is disposed on the condenser side of the heat exchanger, while a second end of each mini-channel is disposed on the evaporator side. As a consequence, the mini-channels are not bent into a serpentine configuration. Since the mini-channels extend consistently in a straight way, they do not comprise any bents at all. Further preferred, the mini-channels extend parallel to each other. In addition, the mini-channels can extend parallel to a longitudinal direction of the heat exchanging element. In particular the longitudinal direction of the heat exchanging element corresponds to the longitudinal direction of the mini-channels and/or the channels and/or the heat exchanger.

The barrier runs in a cross direction of the heat exchanger, perpendicular to the longitudinal direction of the heat exchanging element. In particular, the heat exchanging element extends through the barrier. Especially, all the mini-channels extend through the barrier. In other words, the heat exchanging element or rather the mini-channels penetrate the barrier, especially in a perpendicular way. Advantageously, the barrier is arranged perpendicular to the longitudinal direction of the heat exchanging element.

The condenser fan and the evaporator fan are preferably arranged such that the first air stream and a second air stream both penetrate the heat exchanging element, preferably substantially perpendicular to the longitudinal direction of the heat exchanging element.

In particular, the heat exchanger comprises partition walls on the evaporator side and partition walls on the condenser side. The partition walls can be metal plates. The partition walls are disposed such that chambers on the evaporator side and chambers on the condenser side are formed, wherein at least one end of a mini-channel extends into each chamber. The chambers can be hermetically sealed and can further preferably be understood as manifolds, wherein the partition walls can be considered baffles. Advantageously, the partition walls extend in longitudinal direction of the heat exchanging element, in other words parallel to the longitudinal direction of the mini-channels. The chambers can be offset with regard to each other in cross direction of the heat exchanging element such that a serpentine flow pattern is achieved.

In particular, at least one end of at least two, especially of exactly two or three or four, mini-channels, respectively, extends into a majority of chambers, especially into each chamber, except for one chamber on the evaporator side. Especially, at least one end of at least two, especially of exactly two or three or four, mini-channels, respectively, extends into each chamber.

Further preferred, the chambers define multiple groups of mini-channels, each group comprising at least one mini-channel. Further preferred, at least one group, preferably a majority of groups, especially all groups, comprises more than one mini-channel, particularly at least two mini-channels, especially between two and six mini-channels, most preferred exactly two mini-channels, respectively. In particular, all the groups comprise the same number of channels. Especially, the heat exchanging element comprises between 2 and 30, especially between 5 and 20, in particularly between 13 and 17, groups. Most preferred the heat exchanging element comprises 15 groups.

Preferably, a group is defined such that the mini-channels of the same group extend with their first ends into the same chamber on the condenser side and with their second ends into the same chamber on the evaporator side. This means that by the location of the first ends and the seconds ends of the mini-channels with regard to the chambers, mini-channels can be subdivided into groups. In particular, the heat exchanger comprises an even or odd number of groups.

Especially, the mini-channels, in particular the channels of the mini-channels, serve to transport refrigerant from the evaporator side to the condenser side or the other way around. Importantly, all channels of one mini-channel can transport refrigerant into the same direction. In particular, mini-channels of neighboring different groups transport refrigerant in opposite directions. Especially, the mini-channels of neighboring different groups extend with one end, either the first end or the second end, into the same chamber on the evaporator side or the condenser side, whereas on the opposite end, either the first end or the second end, they extend into different chambers. By this configuration, refrigerant can be moved in a serpentine flow pattern within the heat exchanging element without that the channels or the mini-channels are bent. The chambers serve as hermetically closed spaces in which the refrigerant can exit the at least one mini-channel of a group, change its direction of movement and enter the at least one mini-channel of a neighboring group. In other words, the chambers are used for reversing the direction of movement of the refrigerant.

On the evaporator side the refrigerant is preferably heated by means of the first air stream. As a consequence of the heating, the refrigerant, especially its liquid parts, evaporates partially on the evaporator side. The gaseous parts, i.e. the gas bubbles, coalesce into larger bubbles which eventually occupy the respective entire channel cross section. Due to the capillary dimensions of the channels these act to restrict the fluid so that liquid parts of the refrigerant are trapped between gaseous parts and cannot pass one another due to the surface tension of the liquid parts. The transport of the refrigerant is based on positive and negative pressures (in relation to saturation pressure) created by evaporation and condensation on the evaporator side and the condenser side. Evaporation caused by heating by means of the first air stream on the evaporator side creates a localized high pressure region repelling the refrigerant away from that region and towards the condenser side. Conversely, condensation of the refrigerant caused by cooling by means of the second air stream on the condenser side creates a localized low pressure region which pulls the refrigerant toward the condensing side. The key to these driving forces is that they are localized and when a local movement in one mini-channel is caused, movement is also created in the adjacent channel due to the serpentine flow pattern. In general, this creates refrigerant flow back and forward between the evaporator side and the condenser side across the barrier of the heat exchanger. These forces, also called bubble pumping action, create a pulsating movement of refrigerant across the barrier and overall a serpentine movement.

In detail, a serpentine flow is allowed by means of the mini-channels and the chambers between a first chamber on the evaporator side and a first chamber on the condenser side, further to a second chamber on the evaporator side and then to a second chamber on the condenser side, and so forth and so on, until finally a last chamber on the evaporator side is reached. In particular, the first chamber and the last chamber on the evaporator side constitute the outer most chambers of the heat exchanging element on the evaporator side in a cross direction of the heat exchanging element. The flow pattern can also start from a first chamber on the condenser side to a first chamber on the evaporator side, and so forth and so on, until a last chamber on the condenser side.

By having more than one mini-channel within at least one group, especially the majority of groups, in particular all the groups, a parallel movement of refrigerant in the same direction either to the evaporator side or the condenser side is achieved. Refrigerant can use multiple mini-channels within the same group to travel from the evaporator side to the condenser side or the other way around.

The heat exchanger, in particular the heat exchanging element, can comprise a connection element, which is especially tube-shaped, on the evaporator side and/or the condenser side. Especially, the connection element is closed on both its axial ends by respective walls. Each connection element can form an inner space. The connection element can be disposed such that all of the mini-channels of the heat exchanging element extend into its inner space. In particular, the mini-channels penetrate through a wall segment of the connection element to reach this inner space. Especially the mini-channels penetrate a first wall segment of the connection element, especially in a perpendicular direction. After penetrating the first wall segment, the mini-channels do not contact any part of the connection element but their ends disposed within the inner space between formed by the connection element. In particular, the partition walls subdivide the inner space formed by the connection element into chambers which are fully separated by means of the partition walls.

Especially, the partition walls extend in a plane which is defined by the longitudinal direction of the heat exchanging element and a thickness direction of the heat exchanging element. In particular, there are no other inner walls or plates arranged within the connection element for helping the fluid reverse its direction of movement. In particular, there are no inner walls or plates extending in cross direction and thickness direction of the heat exchanging element disposed within the connection elements. Especially, there are no inner walls or plates within the connection elements at all except for the partition walls.

Only providing the partition walls allows for an easy construction of the chambers for reversing the direction of flow. The partition walls can end in a flush way with an outer or inner surface of a first wall segment and/or in a flush way with an outer or inner surface of a second wall segment of the connection element (wherein the second wall segment is opposite the first wall segment).

Advantageously, the heat exchanging element comprises fill ports allowing the heat exchanging element to be evacuated and partially filled with the refrigerant. In particular, a closed loop pipe connects the first chamber and the last chamber on the evaporator side or the condenser side and thus constitutes a closed loop. The fill port is connected with the closed loop pipe. In particular, the partition walls and/or the closed loop pipe and/or the fill ports are made out of aluminum.

Another advantage of the heat exchanger according to the invention is that it can operate in any orientation with relation to gravity without major loss of performance. This also covers a horizontal orientation. Further, since there can be more than one mini-channel per group, the heat exchanging element can be adapted in design easily to various situations while at the same time inhibiting a pressure drop and maintaining its performance. Additionally, the driving forces of the heat exchanging element, in other words the bubble pumping action, is proportional to the number of groups, in other words passes, between the evaporator side and the condenser side of the heat exchanger.

In particular, the heat exchanger comprises metal plates being disposed between neighboring mini-channels. This can refer to mini-channels of the same group and/or to mini-channels of different groups. The metal plates are preferably configured as fins, especially pleated fins. The fins are advantageously made of aluminum. The metal plates are preferably brazed between neighboring mini-channels to help heat transfer between the air on the condenser side and/or the evaporator side and the refrigerant within the channels by means on conduction. Apart from facilitating the heat transfer, the metal plates provide stability to the heat exchanging element. Especially, the metal plates are arranged such that there are counts of 4 metal plates per inch to 40 metal plates per inch, optimally 12 metal plates per inch to 25 metal plates per inch, in particular 20 metal plates per inch.

The metal plates can also be arranged in a V-shaped or U-shaped configuration. The metal plates can further be arranged louvered or not louvered. Advantageously, metal plates are arranged at an angle towards the direction in which the mini-channels are extending, especially the longitudinal direction of the heat exchanging element, wherein the angle preferably is between 0° and 90°, more preferred between 60° and 89.9°, even more preferred between 70° and 89.7°, most preferred between 80° and 89.5°. The metal plates are especially arranged such that they have an angle to the longitudinal direction of the heat exchanging element which is 90°.

An angle between neighboring metal plates can be between 0° and 180°, more preferred between 0° and 90°, even more preferred between 0° and 45°, most preferred between 0° and 10°. The metal plates can have a constant thickness, wherein the thickness is advantageously between 0.01 mm to 5 mm, more preferred between 0.025 mm and 2.3 mm, even more preferred between 0.05 mm and 1 mm, most preferred between 0.07 mm and 0.4 mm.

In a further aspect, the invention relates to a method for producing a heat exchanger for cooling an electronic enclosure. The method comprises a step of producing a barrier for separating a condenser side and an evaporator side of the heat exchanger. The term "producing the barrier" preferably refers to an installation of the barrier. In particular, the method is configured for producing the above described heat exchanger. Furthermore, the heat exchanger can comprise a heat exchanging element, wherein the method for producing the heat exchanger can comprise an extrusion step for producing a mini-channel of the heat exchanging element, wherein channels as ports of the mini-channel are formed during extrusion of the mini-channel. Afterwards, the mini-channel and thus also the channels are bent into a serpentine configuration. Alternatively, multiple mini-channels are formed as described above, wherein they are not bent into a serpentine configuration, but as another step of producing the heat exchanger partition walls are put into place on the evaporator side and the condenser side within connection elements to form chambers for allowing the refrigerant to reverse its direction of movement. The partition walls and/or the connection elements are formed as described above.

Furthermore, metal plates can be produced in a brazing step which can be disposed between substantially parallel straight channel sections of the channels or between neighboring mini-channels. The barrier can also be produced in a brazing step. Alternatively, the barrier can be formed with caulk or plates which can be glued in place. Preferably, the metal plates are produced in the same brazing step as the barrier. If not formed in the same brazing step as the metal plates, the barrier is formed after the metal plates are formed. In addition, the barrier can comprise a first part which can be connected to the parallel mini-channels by brazing, while this first part is placed in a cutout of an interior wall of the heat exchanger and is connected, preferably also by brazing, with the edges of the interior wall forming the cutout so that the interior wall and the first part form the barrier which hermetically divides the evaporator side and the condenser side.

Furthermore, the invention relates to a use of a pulsating heat pipe in a heat exchanger for cooling an electronic enclosure, wherein the heat exchanger is preferably configured as descried above. In another aspect, the invention regards the use of a heat exchanger, in particular as described above, for cooling an electronic enclosure.

BRIEF DESCRIPTION OF THE DRAWINGS

The above-mentioned and the other features of the invention disclosed herein are described below with reference to the drawings of the preferred embodiments. The illustrated embodiments are intended to illustrate, but not to limit the inventions. The drawings contain the following figures:

FIG. 3 a longitudinal sectional view along the line A-A of FIG. 2;

FIG. 4 a cross sectional view along the line B-B of FIG. 3;

FIG. 5 an enlarged cross sectional view of a mini-channel;

FIG. 15 a sectional view of another heat exchanger according to the invention.

DETAILED DESCRIPTION OF THE PREFERRED EMBODIMENTS

Figure 1:
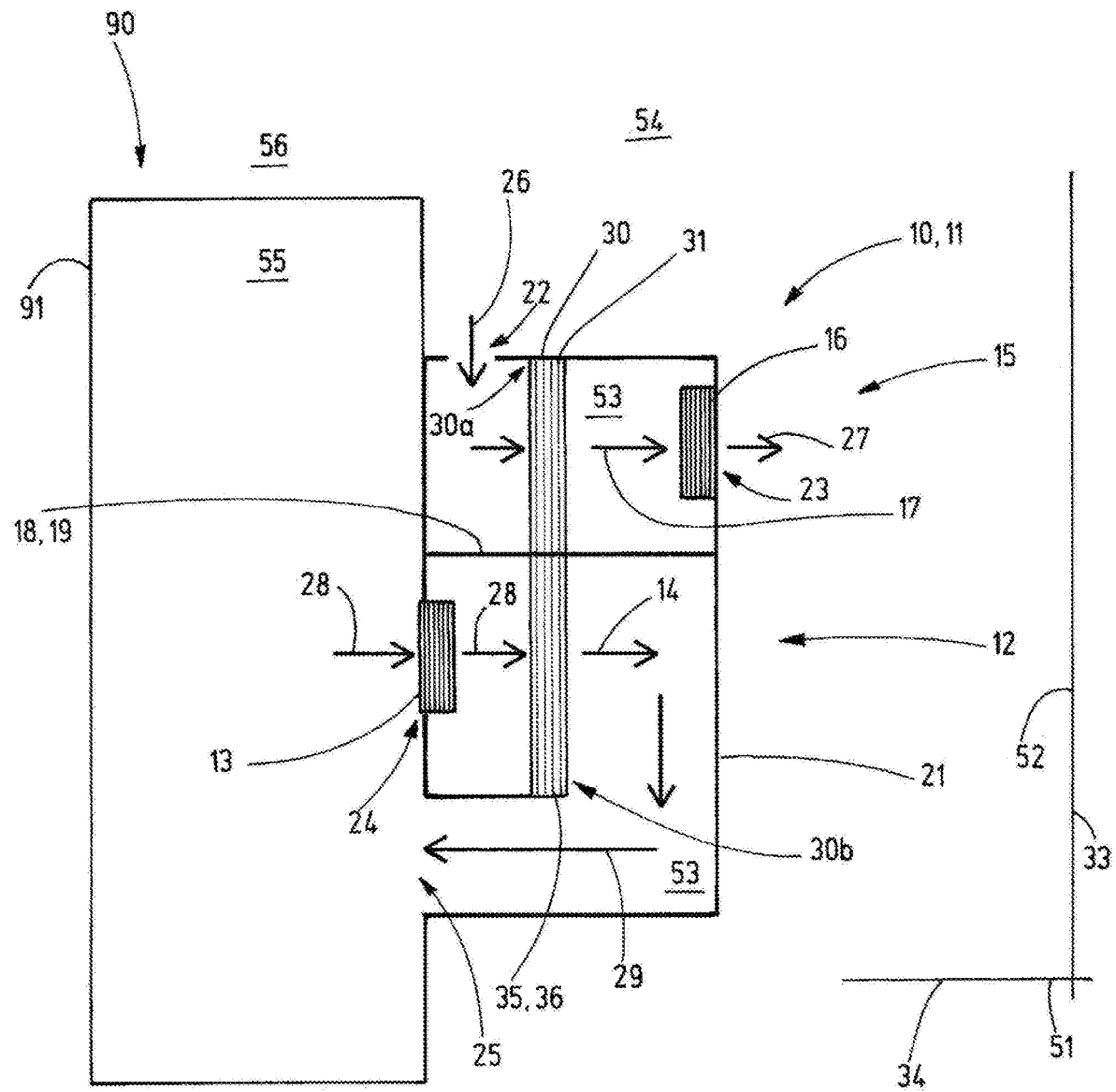
FIG. 1 a longitudinal sectional view of a heat exchanger according to the invention being attached to an electronic enclosure.

FIG. 1 shows a longitudinal sectional view of a heat exchanger (10) which is configured as an air-to-air heat exchanger (11). The heat exchanger (10) is attached to an electronic enclosure (90). For this purpose, the heat exchanger (10) comprises a casing (21) which is attached to the respective casing (91) of the electronic enclosure (90). The casing (91) defines an inside (55) and an outside (56) of the electronic enclosure (90).

The heat exchanger (10) comprises a condenser side (15) and an evaporator side (12). The condenser side (15) is separated from the evaporator side (12) by a barrier (18) which is configured as a metal plate (19), namely an inner wall (20) in the casing (21).

The condenser side (15) and the evaporator side (12) are both disposed in an inside (53) of the heat exchanger (10). The heat exchanger (10) comprises on its evaporator side (12) an evaporator fan (13) configured to produce a first air stream (14). Furthermore, the heat exchanger (10) has a condenser fan (16) on the condenser side (15) configured to produce a second air stream (17). The barrier (18) is configured to separate the first air stream (14) and the second air stream (17).

The heat exchanger (10) comprises a heat exchanging element (30) which is configured as a pulsating heat pipe (31). The heat exchanging element (30) comprises an extruded metallic material (35) which is aluminum (36). The heat exchanging element (30) has a longitudinal direction (33) which is parallel to a wall section of the casing (91) of the electronic enclosure (90) onto which the heat exchanger (10) is attached. The barrier (18) runs in a cross direction (34) which is perpendicular to the longitudinal direction (33) of the heat exchanging element (30). The heat exchanging element (30) is disposed on the evaporator side (12) as well as on the condenser side (15) of the heat exchanger (10). It penetrates the barrier (18).

On the condenser side (15) the casing (21) of the heat exchanger (10) comprises a first opening (22) for letting cool ambient air (26) from an outside (54) of the heat exchanger

(10) enter the inside (53) of the heat exchanger. The cool ambient air (26) is drawn in through the first opening (22) on the condenser side by means of the condenser fan (16). The cool ambient air (26) enters the inside (53) through the first opening (22) and passes through the heat exchanging element (30) towards the condenser fan (16).

At the location of the condenser fan (16) the casing (21) of the heat exchanger (10) comprises a second opening (23) for letting hot air (27) exit the inside (53) of the heat exchanger (10) at its condenser side (15) to the outside (54). By "hot air" the ambient air which is heated by means of passing through the heat exchanging element (30) is meant. The cool ambient air (26) passing through the heat exchanging element (30) and exiting by the second opening (23) to the outside (54) of the heat exchanger (10) in form of hot, i.e. heated, air (27) forms the second air stream (17).

On the evaporator side (12) the casing (21) of the heat exchanger comprises a third opening (24) for letting hot air (28) from an inside (55) of the electronic enclosure (90) enter the inside (53) of the heat exchanger (10). The hot air (28) is drawn in from the electronic enclosure (90) to an inside (53) of the heat exchanger (10) by means of the evaporator fan (13) which is disposed at the third opening (24). The drawn in hot air (28) passes through the heat exchanging element (30) and returns back through a fourth opening (25) in the casing (21) in form of cool air (29), i.e. cooled by means of passing through the heat exchanging element, air to the inside (55) of the electronic enclosure (90). The hot air (28) from the electronic enclosure (90) travelling through the heat exchanging element (30) and returning to the electronic enclosure (90) in form of cool air (29) forms the first air stream (14) which is produced by the evaporator fan (13). After passing the heat exchanging element (30) and before returning to the inside (55) of the electronic enclosure (90) the first air stream (14) is deflected on an inner wall of the casing (21). Thus, for allowing the first air stream (14) and the second air stream (17) the casing (21) of the heat exchanger (10) comprises two openings respectively on the evaporator side (12) and the condenser side (15).

The condenser side (15) of the heat exchanger (10) is located higher than the evaporator side (12). The condenser side (15) is located above the evaporator side, so that the longitudinal direction (33) of the heat exchanger (10) corresponds to the vertical direction (52), wherein a cross direction (34) being perpendicular thereto corresponds to the horizontal direction (51).

Figure 2:
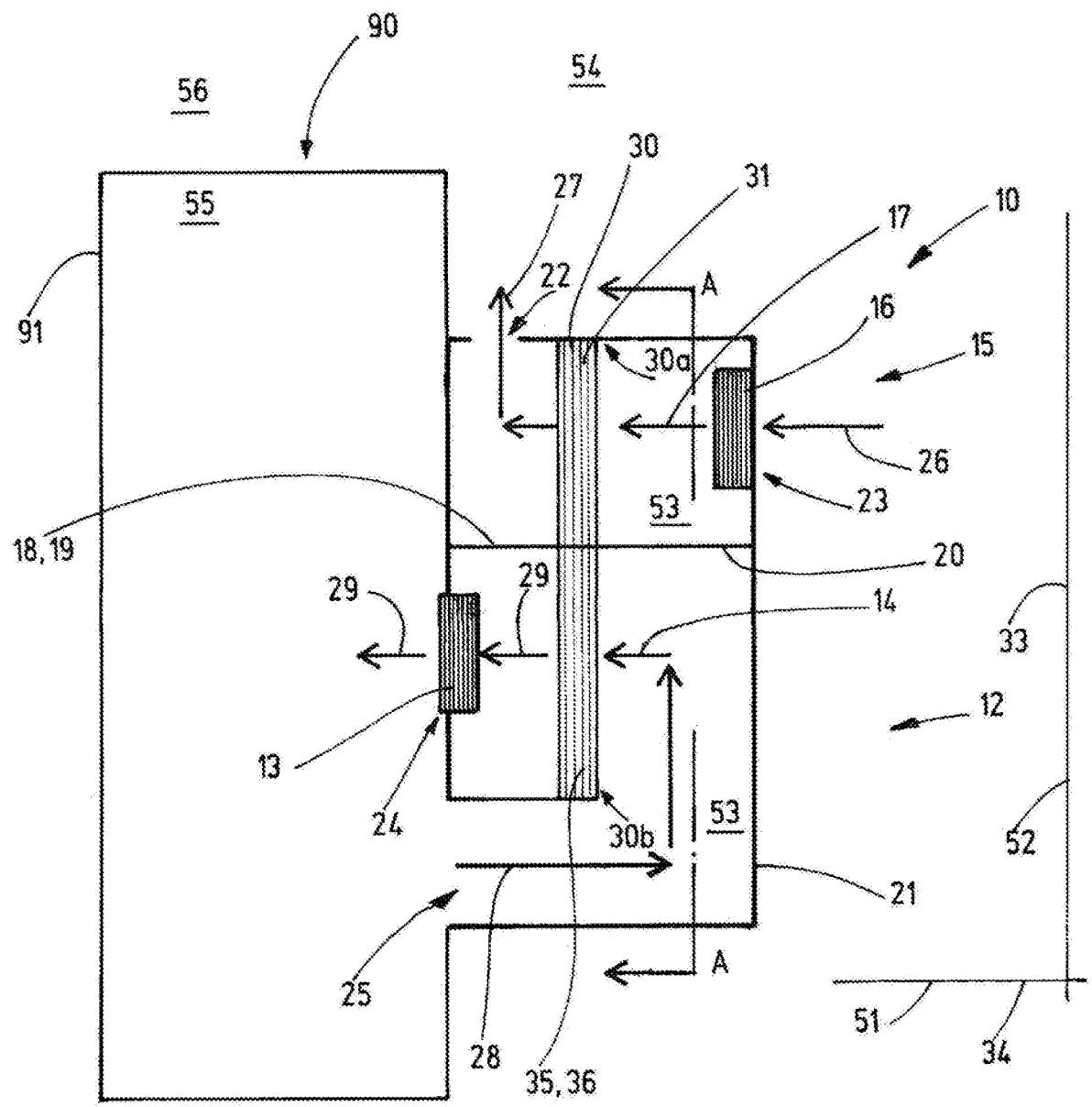
FIG. 2 a longitudinal sectional view of the heat exchanger according to FIG. 1 wherein the direction of the first air stream and the second air stream is reversed.

In FIG. 2 a longitudinal sectional view of a heat exchanger (10) according to FIG. 1 is depicted wherein the first air stream (14) and the second air stream (17) are reversed in their respective flow direction. Otherwise, the configuration of the heat exchanger (10) is exactly the same as shown in FIG. 1.

To reverse the flow direction, the rotational direction of the evaporator fan (13) as well as the condenser fan (16) can be reversed. In detail, the condenser fan (16) draws in cool ambient air (26) through the second opening (23) at which the condenser fan (16) is disposed. The cool ambient air (26) enters the inside (53) of the heat exchanger (10) at its condenser side (15), passes through the heat exchanging element (30) and exits to the outside (54) of the heat exchanger (10) by means of the first opening (22) within the casing (21) in the form of hot, i.e. heated, air (27).

On the evaporator side (12) hot air (28) from the inside (55) of the electronic enclosure (90) enters the inside (53) of the heat exchanger (10) by means of the fourth opening (25), makes a 180° turn by deflection at an inner wall of the casing (21) of the heat exchanger, travels through the heat exchanging element (30) and exits the inside (53) of the heat exchanger (10) to the inside (55) of the electronic enclosure (90) through the third opening (24) in the form of cool, i.e. cooled, air. At the third opening (24) the evaporator fan (13) is disposed.

The condenser fan (16) is therefore able to either push air through the heat exchanging element (30) or pull air through it. The same applies to the evaporator fan (13).

FIG. 3 shows a view on a longitudinal section along the line A-A of FIG. 2. The heat exchanging element (30) has a plurality (37) of channels (38). The heat exchanging element (30) has a first end area (30a) being disposed on the condenser side (15) of the heat exchanger (10) and a second end area (30b) being disposed on the evaporator side (12).

The channels (38) are configured as micro-channels (39) and bent into a serpentine configuration (42). The micro-channels (39) are part of one mini-channel (57). In other words, the micro-channels (39) are formed as ports of the mini-channel (57) which has a substantially rectangular shape. The heat exchanging element (30) comprises only one mini-channel (57) having six micro-channels (39).

The serpentine configuration (42) is formed by the mini-channel (57) being bent multiple times. The serpentine configuration (42) comprises a series of substantial parallel straight channel sections (40) of the micro-channels (39).

Exemplarily, a first channel section (40a), a second channel section (40b) and a third channel section (40c) are depicted. The first channel section (40a) extends in a straight way from the first end area (30a) of the heat exchanging element (30) to the second end area (30b) of the heat exchanging element (30). At the second end area (30b) a first bend (43a) is disposed, which is a 180° turn. This means that the first channel section (40a) which extends straight from the first end area (30a) to the second end area (30b) is turned 180° into the second channel section (40b) travelling in a parallel way to the first channel section (40a) from the second end area (30b) towards the first end area (30a). At the first end area (30a) a second bend (43b) is disposed, again a turn of 180°, turning the second channel section (40b) into the third channel section (40c) travelling in a parallel way to the first channel section (40a) and the second channel section (40b). At the second end area (30b) there is again a third bend (43c) turning the third channel section (40c) into another parallel extending channel section travelling towards the first end area (30a) and so forth and so on. All in all, the serpentine configuration (42) comprises ten channel sections (40) running parallel to each other as well as five bends (43) at the second end area (30b) and four bends (43) at the first end area (30a) of the heat exchanging element (30).

The heat exchanger (10) can comprise more than one heat exchanging element (31). The heat exchanging elements (31) can be stacked in the cross direction (34) to form a heat pipe array. This arrangement has the advantages of gaining additional cooling capacity compared to a heat exchanger (10) having only one heat exchanging element (31).

Metal plates (47) are disposed between neighboring sections (57a) of the mini-channel (57). In other words, in between neighboring channel sections (40), for example between the first channel section (40a) and the second channel section (40b), of the channels (38) metal plates (47) in the form of fins (48), namely pleated aluminum fins (49), are disposed. The pleated aluminum fins (49) are arranged at an angle (50) towards the direction in which the channels sections (40) are extending, especially the longitudinal direction (33) of the heat exchanger (10). The pleated aluminum fins (49) are arranged in a V-shaped configuration between neighboring channel sections (40). The heat exchanger (10) can thus be configured as a finned air-to-air pulsating heat pipe or finned air-to-air pulsating heat pipe array.

The channels (38) are partially filled with a refrigerant (44), namely a two-phase refrigerant (45). The channels (38) are evacuated and filled with the refrigerant (44) by means of fill ports (46) which are disposed at the first end area (30a) of the heat exchanging element (30). The fill ports (46) can, after the heat exchanging element (30) is evacuated and partially filled with the refrigerant (44), be temporarily capped or sealed off.

The two-phase refrigerant (45) is present within the channels (38) in a gaseous state and a liquid state. This means that the channels are filled with liquid parts and gaseous parts of the two-phase refrigerant (45) which do not form a continuous phase respectively. Rather, the liquid parts and gaseous parts are intermixed. The gaseous parts are formed by gas bubbles, while the liquid parts are formed by drops or larger accumulations of liquid.

On the evaporator side (12) the refrigerant (44) is heated by means of the first air stream (14). The pleated aluminum fins (49) facilitate the heat transfer from the hot air (28) from the inside (55) of the electronic enclosure (90) and the refrigerant (44) in the channels (38) via conduction. On the condenser side (15), the pleated aluminum fins (49) facilitate the heat transfer between the cool ambient air (26) and the refrigerant (44) in the channels (38).

As a consequence of the heating, the refrigerant (44), especially its liquid parts, evaporates partially on the evaporator side (12). The gaseous parts, i.e. the gas bubbles, coalesce into larger bubbles which eventually occupy the respective entire channel (38) trapping liquid parts of the refrigerant in between them. Due to the bubbles rising, they take the trapped parts of liquid with them.

Due to the capillary dimensions of the channels (38) these act to restrict the fluid so that liquid parts of the refrigerant are trapped between gaseous parts and cannot pass one another due to the surface tension of the liquid parts. The transport of the refrigerant (44) is based on positive and negative pressures (in relation to saturation pressure) created by evaporation and condensation on the evaporator side (15) and the condenser side (12). Evaporation caused by heating by means of the first air stream (14) on the evaporator side (15) creates a localized high pressure region repelling the refrigerant (44) away from that region and towards the condenser side (12). Conversely, condensation of the refrigerant (44) caused by cooling by means of the second air stream (17) on the condenser side (12) creates a localized low pressure region which pulls the refrigerant (44) toward the condensing side (15). The key to these driving forces is that they are localized and when a local movement in one channel section (40) is caused, movement is also created in adjacent channels sections (40) due to the serpentine configuration (42). In general, this creates refrigerant flow back and forward between the evaporator side (15) and the condenser side (12) across the barrier (18) of the heat exchanger (10).

FIG. 4 shows a cross sectional view along the line B-B of FIG. 3. The channels (38) are depicted in cross section showing their cross dimension (41). The channels (38) have a substantially oval shape. The mini-channel (57) has a substantially rectangular shape. The heat exchanging element (30) comprises only one mini-channel (57) having six micro-channels (39). In between neighboring sections (57a) of the mini-channel (57), metal plates (47) in the form of pleated aluminum fins (49) are disposed.

FIG. 5 shows an enlarged cross sectional view of a mini-channel (57) of the heat exchanger (10). The mini-channel (57) has a substantially rectangular shape, while the channels (38) have are substantially oval-shaped. The channels (38) are formed as ports of the mini-channel (57).

Figure 6:
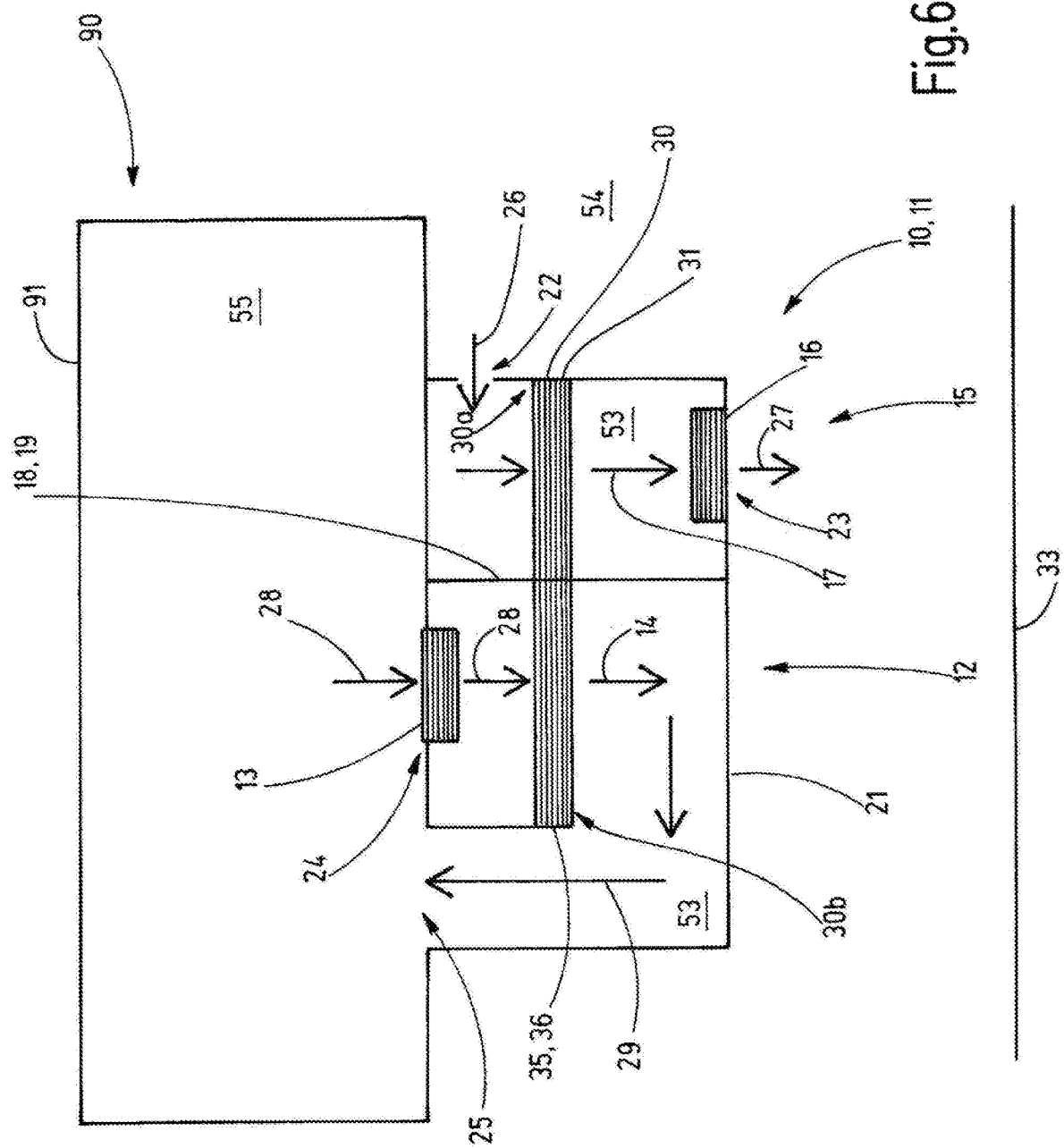
FIG. 6 a sectional top view of another heat exchanger according to the invention.

FIG. 6 shows a sectional top view of a heat exchanger (10) according to the invention. In most aspects the heat exchanger (10) of FIG. 6 is equal to the heat exchanger (10) of FIGS. 1 to 5. Compared to the heat exchanger (10) shown in FIGS. 1 to 5 the heat exchanger (10) of FIG. 6 only has the following differences:

The condenser side (15) is disposed at the same height as the evaporator side (12). The longitudinal direction (33) of the heat exchanging element (30) is therefore parallel to the horizontal plane. As a consequence, also the openings (22, 23, 24, 25) are all disposed in one plane being parallel to the horizontal plane.

Figure 7:
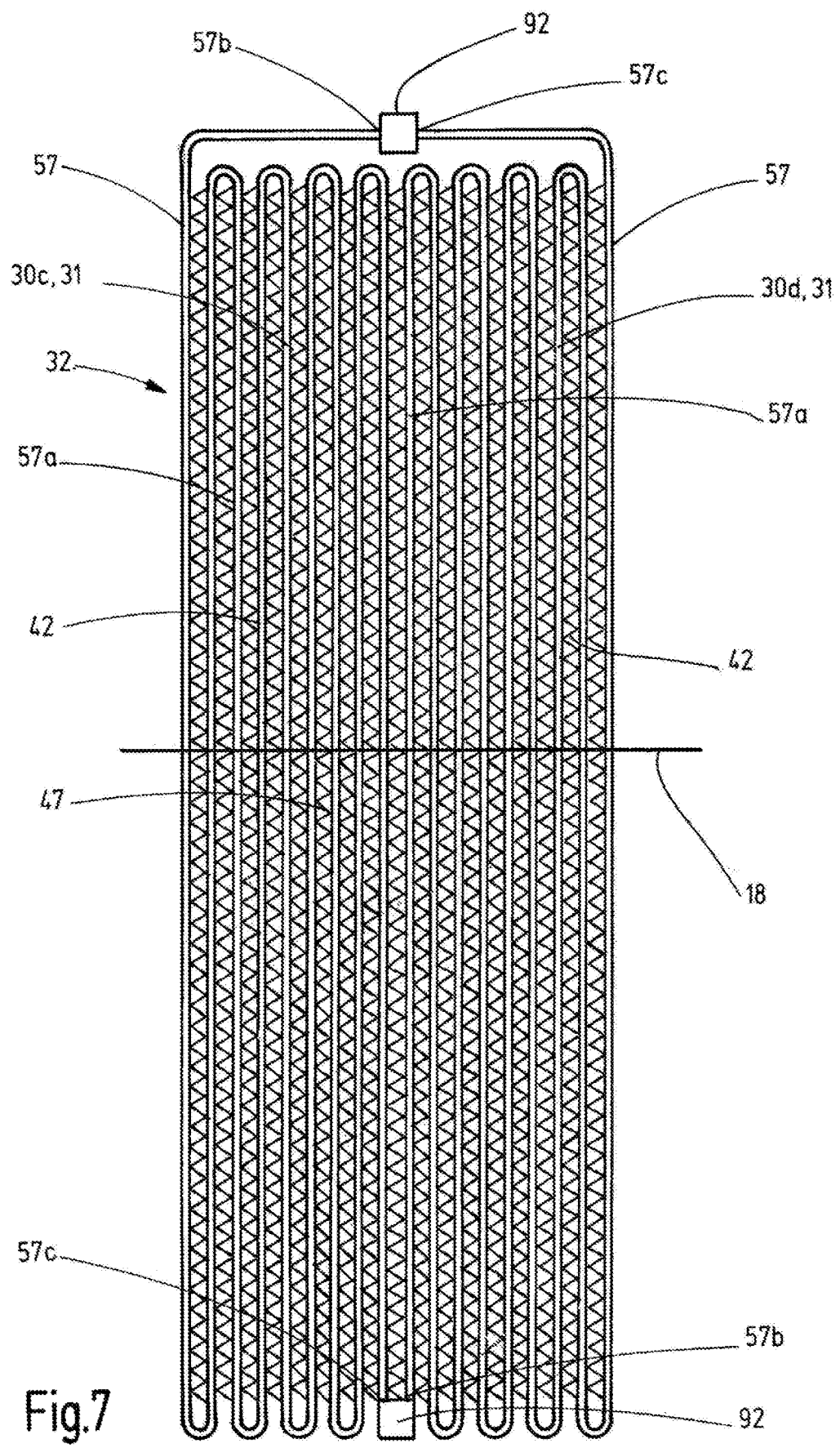
FIG. 7 a side view of a closed loop heat exchanging element array.

In FIG. 7, a side view of a closed loop heat exchanging element array is shown. The array comprises two heat exchanging elements (30), a first heat exchanging element (30c) and a second heat exchanging element (30d). The heat exchanging elements (30c, 30d) are each configured as a pulsating heat pipe (31) so that the array is formed as a pulsating heat pipe array (32). Each heat pipe (31) comprises a mini-channel (57) having a first end (57b) and a second end (57c) being formed in a serpentine configuration (42). To form a closed loop, the first end (57b) of the mini-channel (57) of the first heat exchanging element (30c) is connected to the second end (57c) of the mini-channel (57) of the second heat exchanging element (30d), while the second end (57c) of the mini-channel (57) of the first heat exchanging element (30c) is connected to the first end (57b) of the mini-channel (57) of the second heat exchanging element (30d). In addition, the mini-channels (57) are connected in such a way to each other that also the channels (38) as ports of the mini-channels (57) are connected to each other in a closed loop configuration. The connections are formed by brazing the ends (57b, 57c) into a respective connection port (92). There are metal plates (47) between all neighboring sections (57a) of the same mini-channel (57) in each one of the two heat exchanging elements (30c, 30d) as well as between the neighboring sections (57a) of the different mini-channels (57) of the heat exchanging elements (30c, 30d). A barrier (18) for separating air streams is further provided, which can be configured as a metal plate. The barrier (18) runs in a cross direction to the longitudinal direction of the two heat exchanging elements (30c, 30d).

Figure 8:
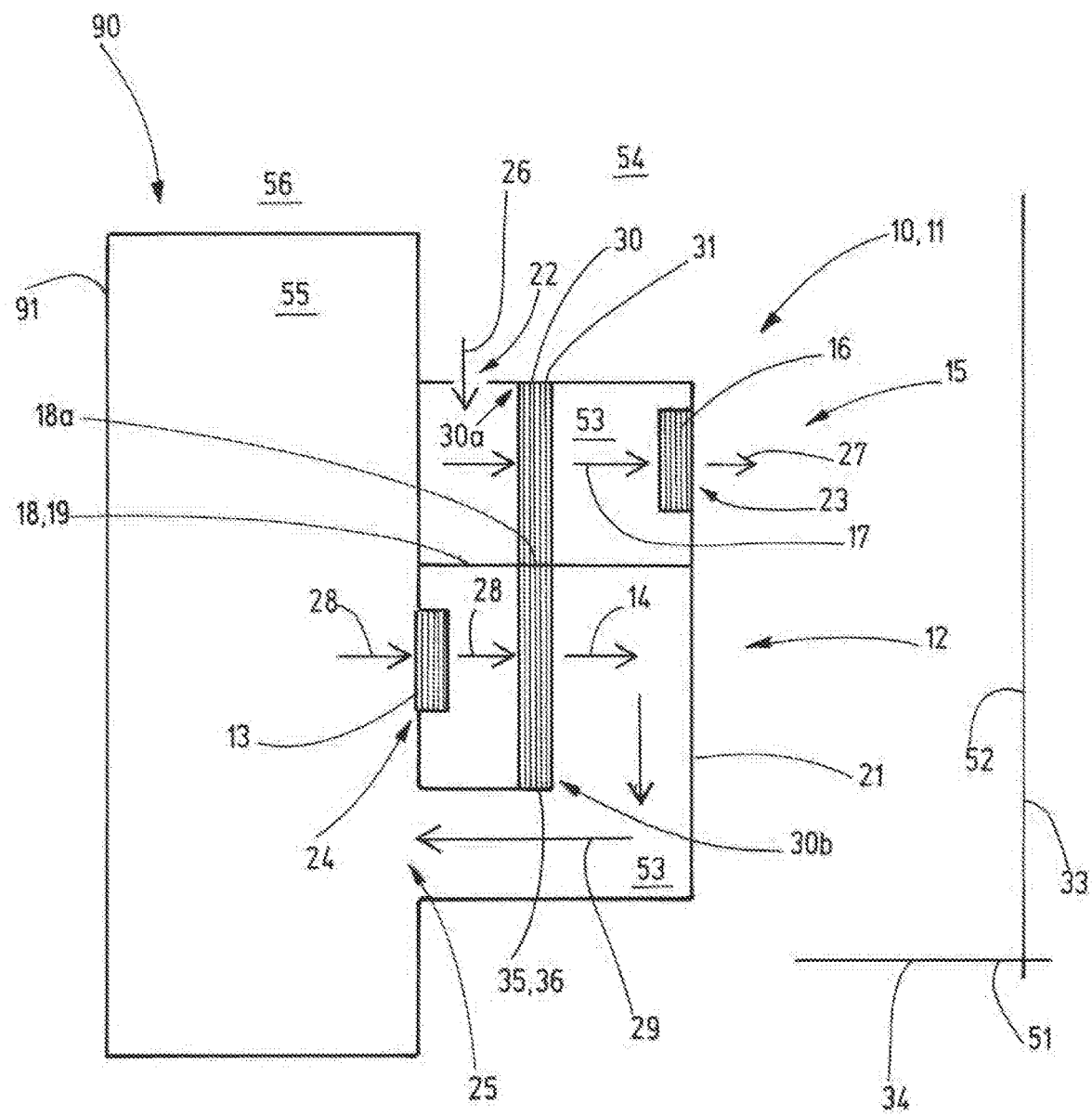
FIG. 8 a longitudinal sectional view of a heat exchanger according to the invention being attached to an electronic enclosure.

FIG. 8 shows a longitudinal sectional view of a heat exchanger (10) which is configured as an air-to-air heat exchanger (11) and which is attached to an electronic enclosure (90). The heat exchanger is in every detail configured as described regarding FIG. 1 except for the fact that the heat exchanging element (30) is different as will be explained in the following.

Figure 9:
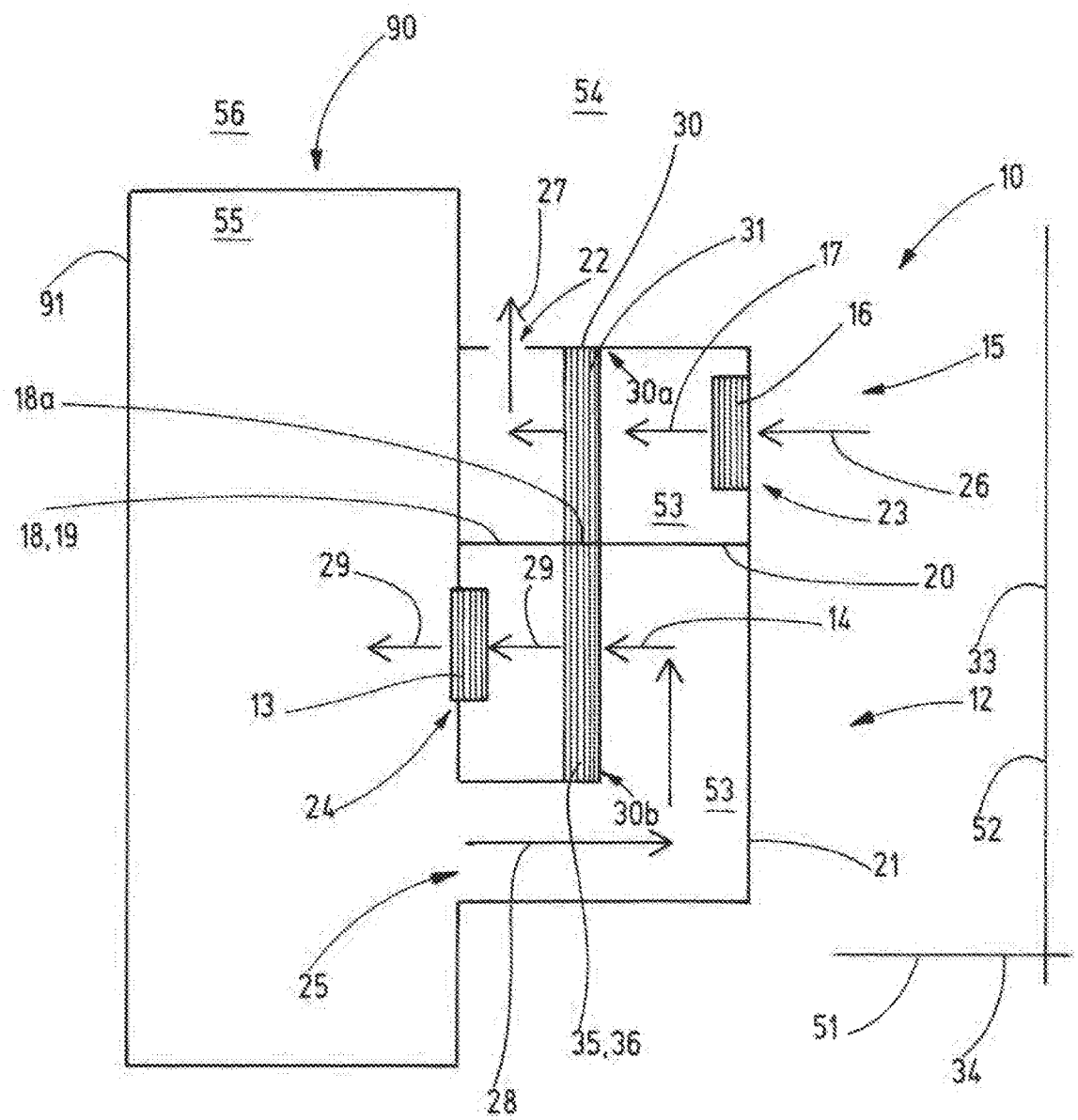
FIG. 9 a longitudinal sectional view of the heat exchanger according to FIG. 8 wherein the direction of the first air stream and the second air stream is reversed.

In FIG. 9 a longitudinal sectional view of the heat exchanger (10) according to FIG. 8 is shown wherein the direction of the first air stream (14) and the second air stream (17) is reversed in their respective flow direction. Otherwise, the configuration of the heat exchanger (10) is exactly the same as shown in FIG. 8. Further, the elaborations regarding FIG. 2 apply as well.

Figure 10:
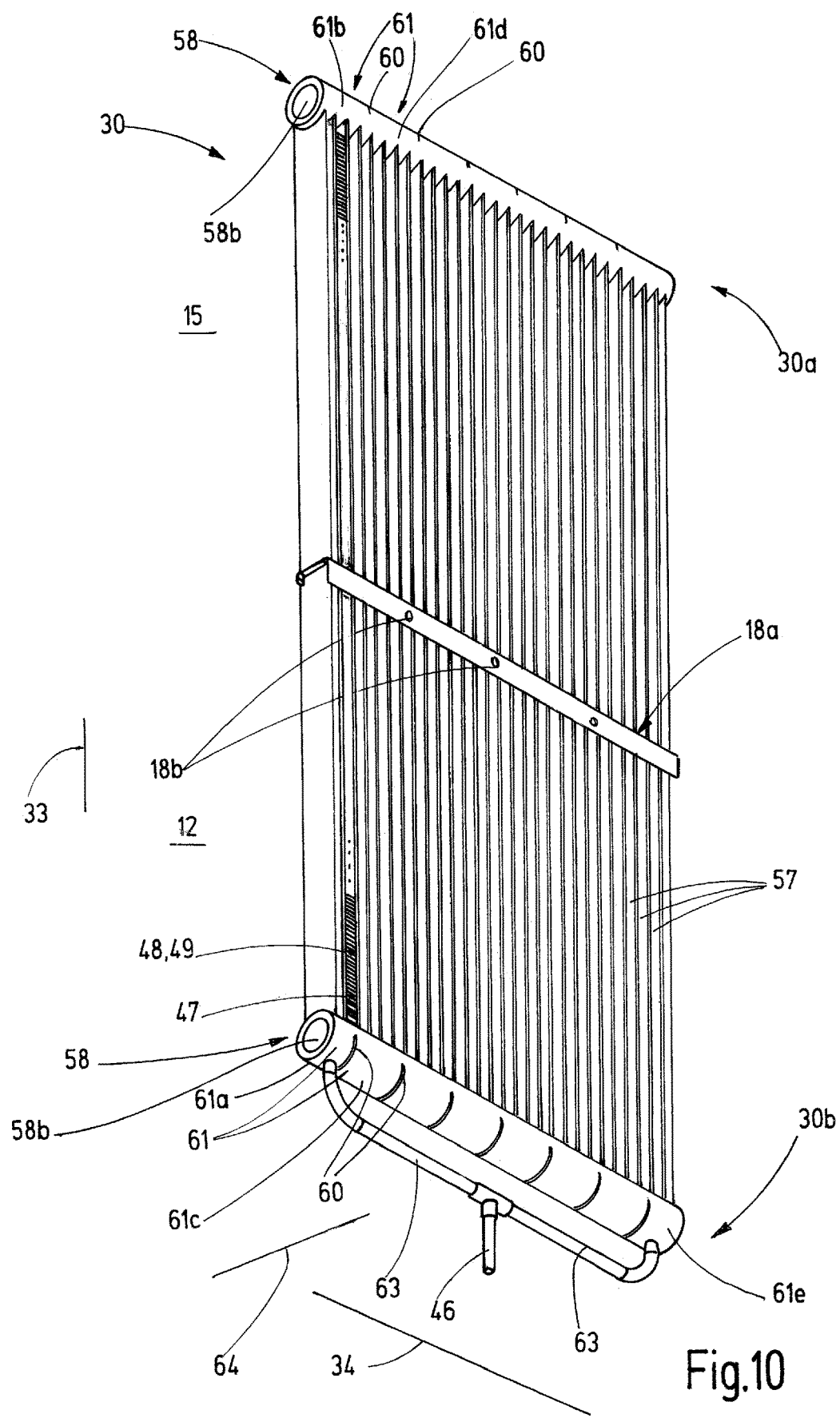
FIG. 10 a perspective view of a heat exchanging element of the heat exchanger of FIGS. 8 and 9.

FIG. 10 shows a perspective view of a heat exchanging element (30) of the heat exchanger (10) according to FIGS. 8 and 9. The heat exchanging element (30) has a first end area (30a) being disposed on the condenser side (15) of the heat exchanger (10) and a second end area (30b) being disposed on the evaporator side (12). The heat exchanging element (30) comprises multiple mini-channels (57).

Metal plates (47) are disposed between neighboring mini-channels (57). The metal plates (47) have the form of fins (48), namely pleated aluminum fins (49). For reasons of simplicity of the figures, the metal plates (47) have only been drawn into the figures section wise. Preferably, the metal plates (47) are arranged between neighboring mini channels along their entire length between the first wall segments (59) of the connection elements (58). The heat exchanger (10) can thus be configured as a finned air-to-air pulsating heat pipe or finned air-to-air pulsating heat pipe array. When being configured as an array the heat exchanger (10) comprises more than one heat exchanging element (30) which can be stacked in cross direction (34) to form a heat pipe array. This arrangement has the advantage of gaining additional cooling capacity compared to a heat exchanger (10) having only one heat exchanging element (30).

The heat exchanging element (30) penetrates the barrier (18) of the heat exchanging element. In FIG. 10, a first part (18a) of the barrier (18) is shown which can be brazed to the heat exchanging element (30). The first part (18a) of the barrier (18) comprises openings (18b), namely bores, for attaching the heat exchanging element (30) in its position as shown in FIG. 8 or 9 within an inner wall (20) of the heat exchanger (10). Thus, the wall (20) and the first part (18a) form the barrier (8).

In its first end area (30a) and its second end area (30b) the heat exchanging element (30) comprises chambers (61) formed by partition walls (60). For example, there is a first chamber (61a) as well as a second chamber (61c) on the evaporator side (12). On the condenser side (15) there is a first chamber (61b) and a second chamber (61d). In total, there are eight chambers (61) on the evaporator side (12) and seven chambers (61) on the condenser side (15). The outer most chambers on the evaporator side (12) is the first chamber (21a) and a last chamber (61e) which are connected by a closed loop pipe (63). The closed loop pipe (63) connects those two chambers (61) with a fill port (46).

Figure 14:
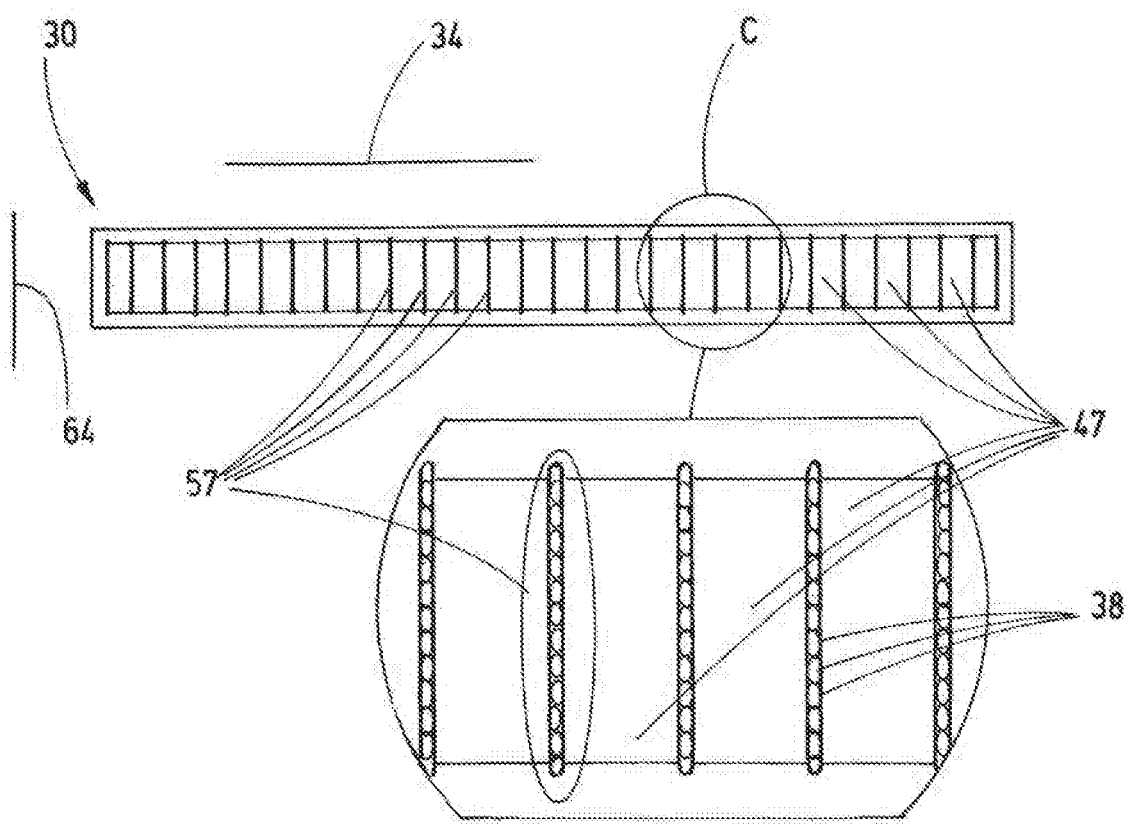
FIG. 14 a cross sectional view of the heat exchanging element according to FIGS. 10 to 13.

The mini-channels (57) comprise multiple channels (38) which cannot be seen in FIG. 10 (see FIG. 14). The channels (38) are partially filled with a refrigerant (44), namely a two-phase refrigerant (45). The channels (38) are evacuated and filled with the refrigerant (44) by means of the fill port (46).

The two-phase refrigerant (45) is present within the channels (38) in a gaseous state and a liquid state. This means that the channels are filled with liquid parts and gaseous parts of the two-phase refrigerant (45) which do not form a continuous phase respectively. Rather, the liquid parts and gaseous parts are intermixed. The gaseous parts are formed by gas bubbles, while the liquid parts are formed by drops or larger accumulations of liquid.

On the evaporator side (12) the refrigerant (44) is heated by means of the first air stream (14). The pleated aluminum fins (49) facilitate the heat transfer from the hot air (28) from the inside (55) of the electronic enclosure (90) and the refrigerant (44) in the channels (38) via conduction. On the condenser side (15), the pleated aluminum fins (49) facilitate the heat transfer between the cool ambient air (26) and the refrigerant (44) in the channels (38).

As a consequence of the heating, the refrigerant (44), especially its liquid parts, evaporates partially on the evaporator side (12). The gaseous parts, i.e. the gas bubbles, coalesce into larger bubbles which eventually occupy the respective entire channel (38) trapping liquid parts of the refrigerant in between them. Due to the bubbles rising, they take the trapped parts of liquid with them.

Due to the capillary dimensions of the channels (38) these act to restrict the fluid so that liquid parts of the refrigerant are trapped between gaseous parts and cannot pass one another due to the surface tension of the liquid parts. The transport of the refrigerant (44) is based on positive and negative pressures (in relation to saturation pressure) created by evaporation and condensation on the evaporator side (15) and the condenser side (12). Evaporation caused by heating by means of the first air stream (14) on the evaporator side (15) creates a localized high pressure region repelling the refrigerant (44) away from that region and towards the condenser side (12). Conversely, condensation of the refrigerant (44) caused by cooling by means of the second air stream (17) on the condenser side (12) creates a localized low pressure region which pulls the refrigerant (44) toward the condensing side (15). In general, this creates refrigerant flow back and forward between the evaporator side (15) and the condenser side (12) across the barrier (18) of the heat exchanger (10).

Figure 11:
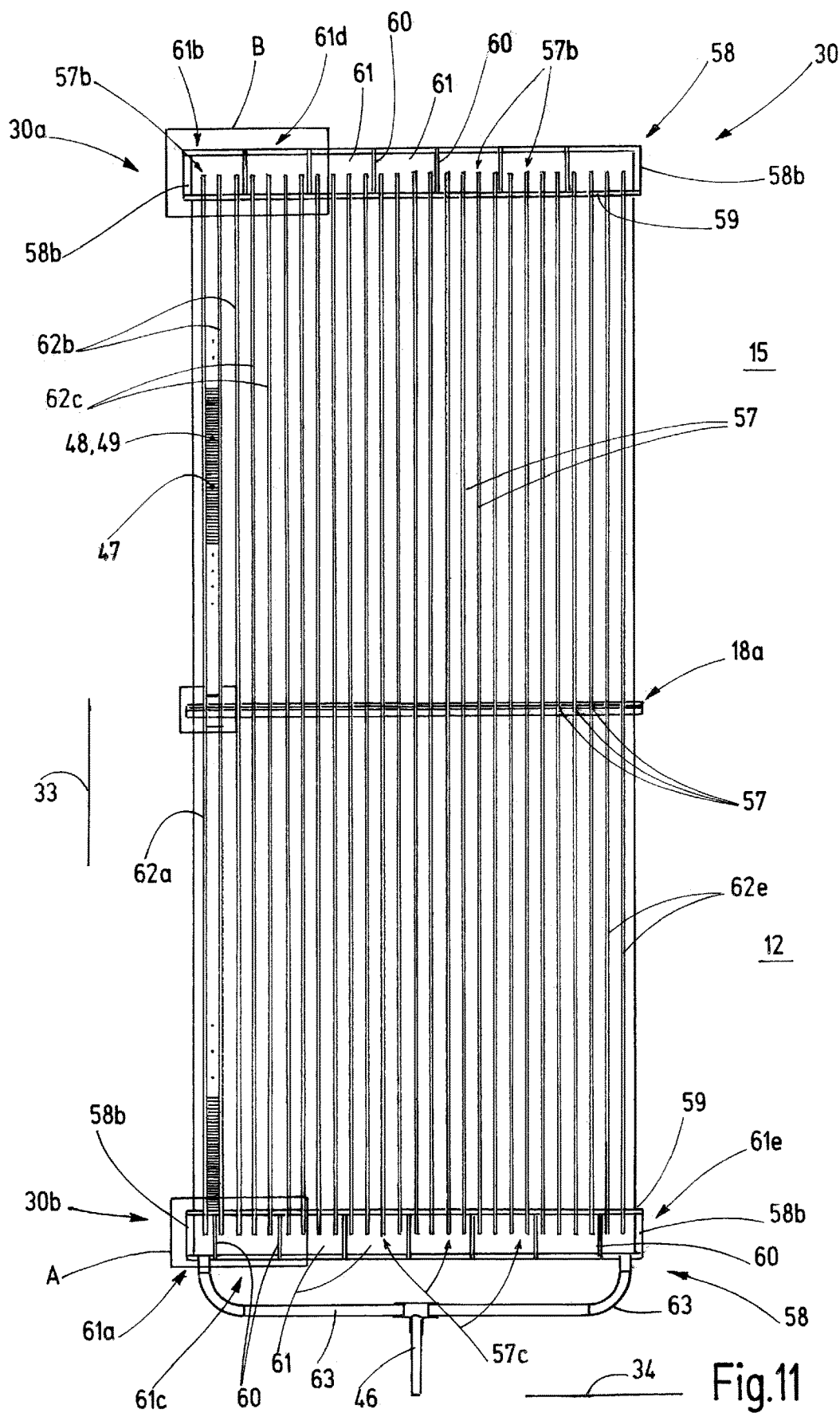
FIG. 11 a longitudinal sectional view of the heat exchanging element of FIG. 10.

FIG. 11 shows a longitudinal sectional view of the heat exchanging element (30) according to FIG. 10).

On the evaporator side (12) and the condenser side (15) the heat exchanging element (30) comprises a connection element (58) respectively. The mini-channels (57) penetrate a first wall segment (59) of the connection element (58) on both sides. In particular, the first wall segments (59) comprise openings for the penetration of the mini-channels (57). As a consequence, the first end (57a) of all mini-channels (57) extends within an inner space (58a) formed by the connection element (58) on the condenser side (15). In addition, the second ends (57c) of all mini-channels (57) extend within the inner space (58a) formed by the connection element (58) on the evaporator side (12).

The heat exchanging element (30) further comprises partition walls (60). The partition walls (60) extend parallel to the longitudinal direction (33) of the heat exchanging element (30) and the thickness direction (64) and perpendicular to a cross direction (34).

The connection elements (58) including walls (58b) on its axial ends and the partition walls (60) on each side define the chambers (61) into which at least one end of a mini-channel extends. For example, on the evaporator side (12) only the second end (57c) of one mini-channel, namely the outer most mini-channel (57) on the left, extends into the first chamber (61a). The other end, thus the first end (57b), of the same mini-channel (57) extends into the first chamber (61b) on the condenser side (15). The outer most mini-channel (57) on the left is the only mini-channel (57) which extends with into the first chamber (61a) on the evaporator side (12) and into the first chamber (61b) on the condenser side (15). This mini-channel (57) therefore constitutes the first group (62a) of mini-channels (57). A second group (62b) is formed by the two mini-channels (57) being disposed right next to the first group (62a) to the right side. With their first ends (57b) they extend into the first chamber (61b) on the condenser side (15), while with their second ends (57c) they extend into the second chamber (61c) on the evaporator side (12). A third group (62c) is formed by the next two mini-channels to the right extending with their second ends (57c) into the second chamber (61c) on the evaporator side (12) and with their first ends (57b) into the second chamber (61d) on the condenser side (15). A fourth group (62d) is disposed next to the third group (62c). The following groups are formed in the same way, wherein each group consists of two mini-channels (57). In this way fourteen groups are formed wherein the last group (62e) is formed by two mini-channels extending into the last chamber (61e) on the evaporator side (12).

By means of the first group (62a) refrigerant (44) moves from the evaporator side (12) to the condenser side (15) past the barrier (18) while by means of the second group (62b) refrigerant can move into the other direction. In the third group (62c) the movement of direction is the same as within the first group (62a). Thus, a serpentine flow pattern can be achieved without bending the mini-channels (57). Instead, partition walls (60) forming the chambers (61) are used for reversing the direction of movement of the refrigerant (44).

Figure 12:
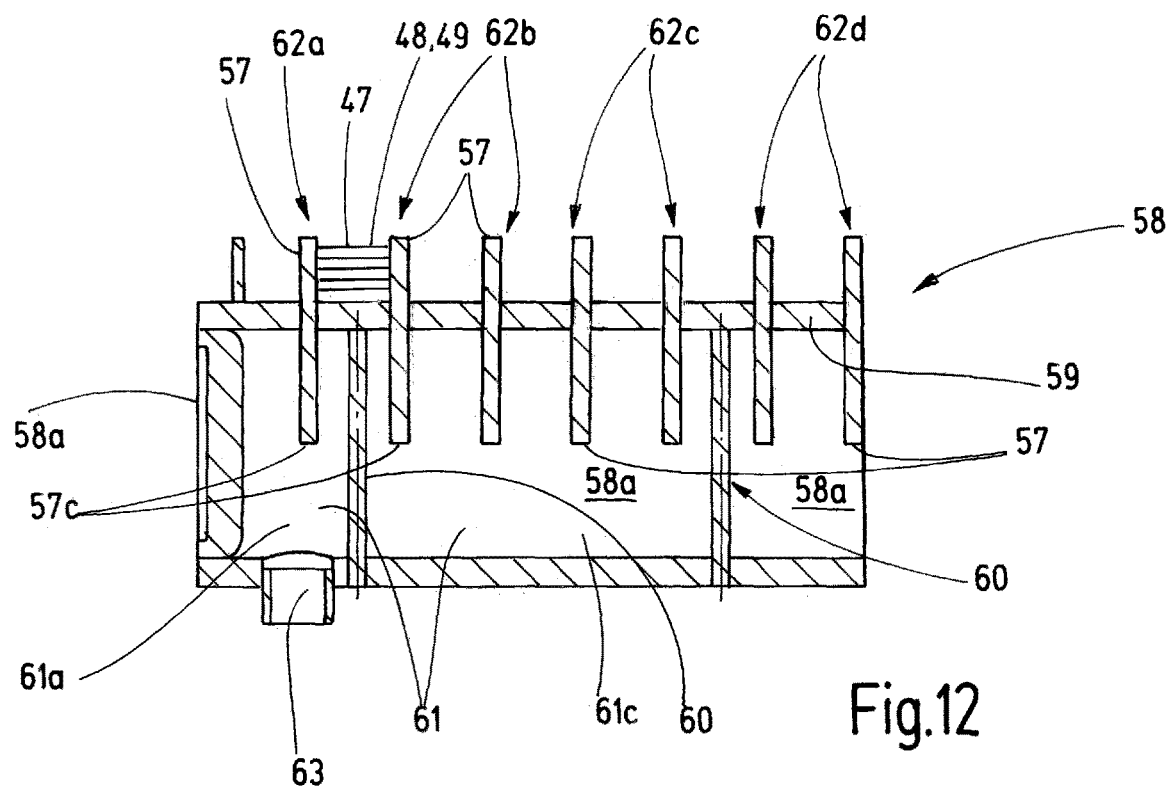
FIG. 12 an enlarged view of section A of FIG. 11.

FIG. 12 shows an enlarged view of section A of FIG. 11. The figure shows in more detail how the second ends (57c) of the mini-channels (57) extend into the chambers (61) on the evaporator side (12).

Figure 13:
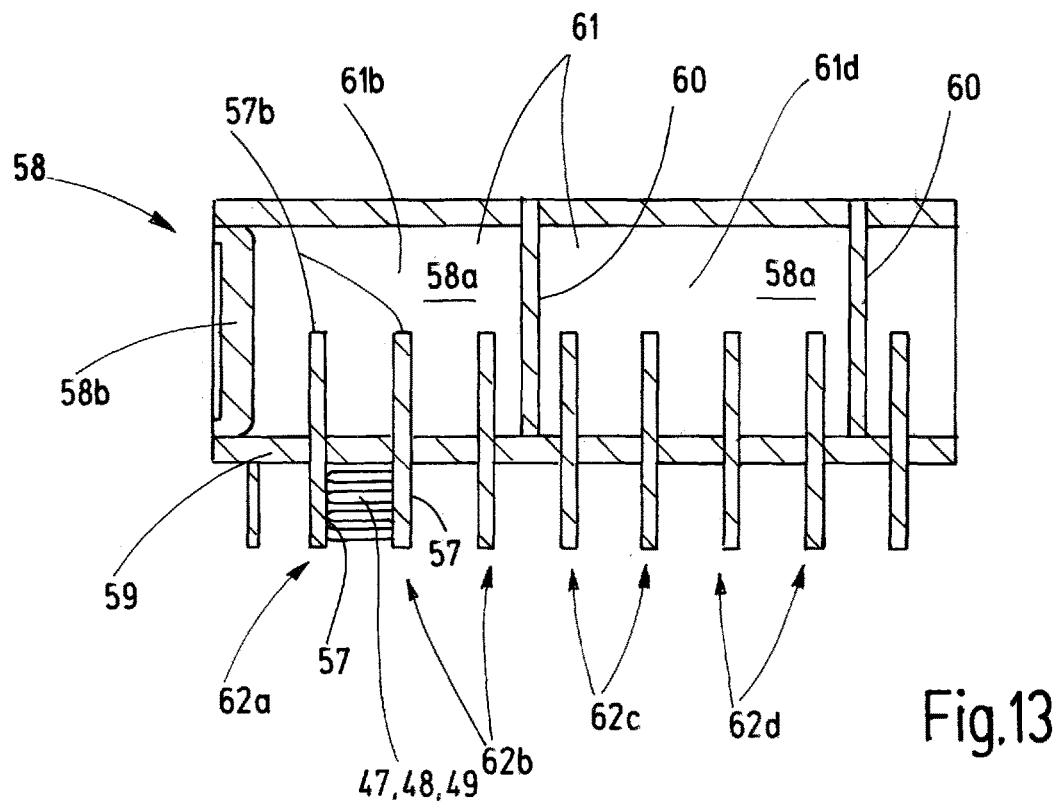
FIG. 13 an enlarged view of section B of FIG. 11.

In FIG. 13 an enlarged view of section B of FIG. 11 is shown. Analogously to FIG. 12, FIG. 13 shows a detailed view of how the first ends (57b) of the mini-channels (57) extend into the chambers (61) on the condenser side (15).

FIG. 14 depicts a cross sectional view of the heat exchanging element (30) according to FIGS. 10 to 13. In the upper half of the figure and especially the lower half of the figure, being an enlarged view of section C of the upper half, it can be seen that the mini-channels (57) have a substantially rectangular shape. The channels (38) have a substantially oval shape with a shorter and a larger cross dimension. One mini-channel (57) comprises preferably thirteen channels (38) which are aligned in a straight way within the mini-channel (57). In other words, the channels (38) are aligned along their larger cross dimension so that the cross section of a mini-channel is elongated.

FIG. 15 shows a sectional view of another heat exchanger (10) according to the invention which is entirely configured as described with the regard to FIG. 6 except for the fact that it comprises a heat exchanging element (30) as described in FIGS. 10 to 14.

The invention claimed is:

1. A heat exchanger for cooling an electronic enclosure, comprising a condenser side and an evaporator side,
wherein the condenser side and the evaporator side are separated from each other by a barrier
wherein the heat exchanger comprises a heat exchanging element,
wherein the heat exchanging element is a pulsating heat pipe,
wherein the heat exchanger comprises multiple mini-channels, said mini-channels not being bent into a serpentine configuration,
wherein each mini-channel comprises multiple channels being configured as ports of the respective mini-channels,
wherein the mini-channels extend consistently in a straight configuration such that a first end of each mini-channel is disposed on the condenser side of the heat exchanger and that a second end of each mini-channel is disposed on the evaporator side,
wherein the mini-channels extend through the barrier,
wherein the heat exchanger comprises partition walls on the evaporator side and partition walls on the condenser side,
wherein the partition walls are disposed such that chambers on the evaporator side and chambers on the condenser side are formed,
wherein at least one end of a mini-channel extends into each chamber,
wherein the chambers define multiple groups of mini-channels, each group comprising at least one mini-channel,
wherein the channels of the mini-channels serve to transport refrigerant from the evaporator side to the condenser side, or from the condenser side to the evaporator side,
wherein all of the channels of each mini-channel lie in a respective plane defined by each said mini-channel, such that no channel of any mini-channel lies in a same plane as a channel of any other of the mini-channels, and
wherein all channels of one mini-channel transport refrigerant in the same direction.

2. The heat exchanger according to claim 1,
wherein the heat exchanger comprises an evaporator fan for producing a first air stream on the evaporator side and a condenser fan for producing a second air stream on the condenser side, wherein the barrier is configured to separate the first air stream and the second air stream.

3. The heat exchanger according to claim 1,
wherein the heat exchanging element comprises an extruded metallic material.

4. The heat exchanger according to claim 1,
wherein at least one group comprises more than one mini-channel,
wherein the mini-channels of the same group extend with their first ends into the same chamber on the condenser side and with their second ends into the same chamber on the evaporator side.

5. The heat exchanger according to claim 1, wherein:
a plurality of mini-channels of the multiple mini-channels form a group of mini-channels; and
wherein all channels within the group of mini-channels transport refrigerant in the same direction.

6. A method for producing a heat exchanger for cooling an electronic enclosure, the heat exchanger having a condenser side and an evaporator side, and a heat exchanging element, the heat exchanging element being a pulsating heat pipe, the method comprising the steps of:
producing a barrier for separating the condenser side and the evaporator side of the heat exchanger,
forming multiple mini-channels of the heat exchanging element by extrusion, wherein channels as ports of the mini-channels are formed during extrusion of the mini-channels,
disposing partition walls into place on the evaporator side and the condenser side within connection elements to form chambers for allowing refrigerant to reverse direction of movement,
wherein the mini-channels are not bent into a serpentine configuration,
wherein each mini-channel comprises multiple channels,
wherein the mini-channels extend consistently in a straight configuration such that a first end of each mini-channel is disposed on the condenser side of the heat exchanger and that a second end of each mini-channel is disposed on the evaporator side,
wherein the mini-channels extend through the barrier,
wherein the heat exchanger comprises partition walls on the evaporator side and partition walls on the condenser side,
wherein the partition walls are disposed such that chambers on the evaporator side are formed, wherein at least one end of a mini-channel extends into each chamber, wherein the chambers define multiple groups of mini-channels, each group comprising at least one mini-channel, wherein the channels of the mini-channels serve to transport the refrigerant from the evaporator side to the condenser side or from the condenser side to the evaporator side, wherein all of the channels of each mini-channel lie in a respective plane defined by each said mini-channel, such that no channel of any mini-channel lies in a same plane as a channel of any other of the mini-channels, and wherein all channels of each mini-channel transport refrigerant in the same direction.

7. The method according to claim 6, wherein the method comprising a brazing step for producing the barrier.

8. A heat exchanger for cooling an electronic enclosure comprising:

a condenser side and an evaporator side, wherein the condenser side and the evaporator side are separated from each other by a barrier, wherein the heat exchanger comprises a heat exchanging element, wherein the heat exchanging element is a pulsating heat pipe, wherein the heat exchanger comprises multiple mini-channels, said mini-channels not being bent into a serpentine configuration, wherein each mini-channel comprises multiple channels being configured as ports of the respective mini-channels, wherein the mini-channels extend consistently in a straight configuration such that a first end of each mini-channel is disposed on the condenser side of the heat exchanger and that a second end of each mini-channel is disposed on the evaporator side, wherein the mini-channels extend through the barrier, wherein the heat exchanger comprises partition walls on the evaporator side and partition walls on the condenser side, wherein the partition walls are disposed such that chambers on the evaporator side and chambers on the condenser side are formed, wherein at least one end of a mini-channel extends into each chamber, wherein the chambers define multiple groups of mini-channels, each group comprising more than one mini-channel, wherein the mini-channels of the same group extend with their first ends into the same chamber on the condenser side and with their second ends into the same chamber on the evaporator side, wherein by having more than one mini-channel in each group a parallel movement of refrigerant in the same direction either to the evaporator side or the condenser side is achieved, wherein mini-channels of neighboring different groups transport the refrigerant in opposite directions, wherein the channels of the mini-channels serve to transport the refrigerant from the evaporator side to the condenser side or from the condenser side to the evaporator side, and wherein all channels of each mini-channel lie in a respective plane defined by each said mini-channel, such that no channel of any mini-channel lies in a same plane as a channel of any other of the mini-channels, and wherein all channels of a respective one mini-channel transport refrigerant in the same direction.

9. The heat exchanger according to claim 8, wherein the heat exchanger comprises an evaporator fan for producing a first air stream on the evaporator side and a condenser fan for producing a second air stream on the condenser side, wherein the barrier is configured to separate the first air stream and the second air stream.

10. The heat exchanger according to claim 8, wherein the heat exchanging element comprises an extruded metallic material.

11. A method for producing a heat exchanger for cooling an electronic enclosure according to claim 8, wherein the method comprises a step of producing a barrier for separating a condenser side and an evaporator side of the heat exchanger, wherein the heat exchanger comprises a heat exchanging element, wherein the heat exchanging element is a pulsating heat pipe, wherein the method comprising an extrusion step for producing a mini-channel of the heat exchanging element, wherein the method comprises forming multiple mini-channels by extrusion, wherein the channels as ports of the mini-channel are formed during extrusion of the mini-channel, and putting partition walls into place on the evaporator side and the condenser side within connection elements to form chambers for allowing the refrigerant to reverse its direction of movement such that the heat exchanger comprises multiple mini-channels, said mini-channels not being bent into a serpentine configuration, wherein each mini-channel comprises multiple channels, wherein the mini-channels extend consistently in a straight configuration such that a first end of each mini-channel is disposed on the condenser side of the heat exchanger and that a second end of each mini-channel is disposed on the evaporator side, wherein the mini-channels extend through the barrier, wherein the heat exchanger comprises partition walls on the evaporator side and partition walls on the condenser side, wherein the partition walls are disposed such that chambers on the evaporator side and chambers on the condenser side are formed, wherein at least one end of a mini-channel extends into each chamber, wherein the chambers define multiple groups of mini-channels, each group comprising more than one mini-channel, wherein the mini-channels of the same group extend with their first ends into the same chamber on the condenser side and with their second ends into the same chamber on the evaporator side, wherein by having more than one mini-channel in each group a parallel movement of refrigerant in the same direction either to the evaporator side or the condenser side is achieved, wherein mini-channels of neighboring different groups transport refrigerant in opposite directions, wherein the channels of the mini-channels serve to transport refrigerant from the evaporator side to the condenser side or from the condenser side to the evaporator side, wherein all of the channels of each mini-channel lie in a respective plane defined by each said mini-channel, such that no channel of any mini-channel lies in a same plane as a channel of any other of the mini-channels, and wherein all channels of one mini-channel transport refrigerant in the same direction.

12. The method according to claim 11, wherein the method comprising a brazing step for producing the barrier.

* * * * *